(12) United States Patent
Hironishi

(10) Patent No.: US 6,256,137 B1
(45) Date of Patent: *Jul. 3, 2001

(54) WAVELENGTH CONVERTER

(75) Inventor: Kazuo Hironishi, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/045,532

(22) Filed: Mar. 23, 1998

(30) Foreign Application Priority Data

Oct. 20, 1997 (JP) .................................... 9-286579

(51) Int. Cl.[7] ...................................... G02F 1/365
(52) U.S. Cl. ............................. 359/332; 385/11
(58) Field of Search .................. 359/326–332; 385/11, 15, 27, 28, 39, 47, 48

(56) References Cited

U.S. PATENT DOCUMENTS

| 4,570,081 | * | 2/1986 | Baldwin | 359/327 |
| 5,099,147 | * | 3/1992 | Gregor et al. | 359/327 |
| 5,787,102 | * | 7/1998 | Alexander et al. | 385/11 X |
| 5,828,484 | * | 10/1998 | Ho et al. | 359/328 X |

FOREIGN PATENT DOCUMENTS

| 0 455 144 | 11/1991 | (EP) . |
| 57-68805 | 4/1982 | (JP) . |
| 8-220573 | 8/1996 | (JP) . |

OTHER PUBLICATIONS

T. Sueta, et al., "High Speed Guided–Wave Optical Modulators", Journal of Optical Communications, vol. 3, 1982, pp. 52–58.

R. C. Alferness, "Waveguide Electrooptic Modulators", IEEE Transactions on Microwave Theory and Technique, vol. MTT–30, No. 8, Aug., 1982, pp. 1121–1137.

IEEE Photonics Technology Letters, vol. 9, No. 4, Apr. 1997, pp. 1449–1451. (Stephens et al.).

IEEE Journal on Selected Areas in Communications, vol. 6, No. 7, Aug. 1988, pp. 1186–1198. (Morioka et al.).

N. Edagawa, et al., "Wavelength Conversion Using an Electroabsorption Modulator", *Proceedings of the 1997 IEICE General Conference*, B–10–218, p. 727, 1997.

G. Raybon, et al., "Reconfigurable Optoelectronic Wavelength Translation Based on an Integrated Electrabsorption Modulated Laser Array", *IEEE Photonics Technology Letters*, vol. 10, No. 2 (Feb. 1998), pp. 215–217.

T. Hosoi, et al, "Polarization Independent Acousto–Optic Filter Integrating Newly Developed Passive Polarization Beam Splitter", *Proceedings of the 1997 IEICE Spring Conference*, C–274, pp. 4–271, 1997.

T. Nakazawa, et al, "Low–Insertion–Loss/Narrow–Band AOTF for ASE Elimination", *Proceedings of the 1997 IEICE Electronics Society Conference*, C–3–35, p. 144, 1997.

* cited by examiner

*Primary Examiner*—John D. Lee
(74) *Attorney, Agent, or Firm*—Staas & Halsey LLP

(57) ABSTRACT

A first polarizer separates an input light of the wavelength $\lambda 2$ into an X polarized wave and a Y polarized wave normal to each other. The input light of wavelength $\lambda 2$ is a linearly polarized wave. The X polarized wave is input to the second polarizer after passing through a semiconductor optical amplifier. The Y polarized wave is led by a reflecting device to the second polarizer. The refractive index of a waveguide of the semiconductor amplifier changes depending on the intensity of an input light. A signal light which is intensity-modulated according to a transmission signal and has the wavelength $\lambda 1$ is input to the semiconductor optical amplifier. The second polarizer couples the X and Y polarized waves. The third polarizer receives and outputs an output light from the second polarizer.

34 Claims, 47 Drawing Sheets

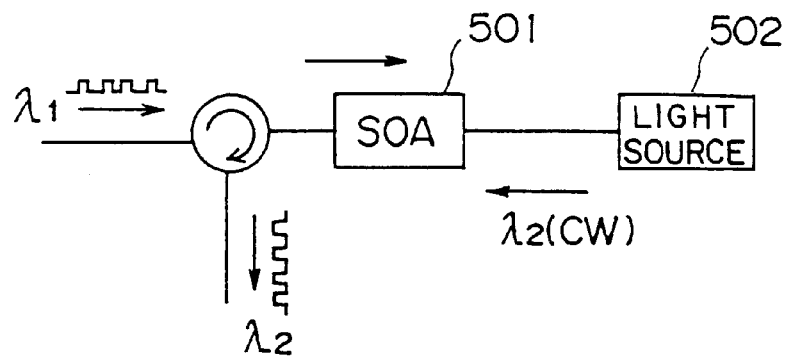
F I G. 1A
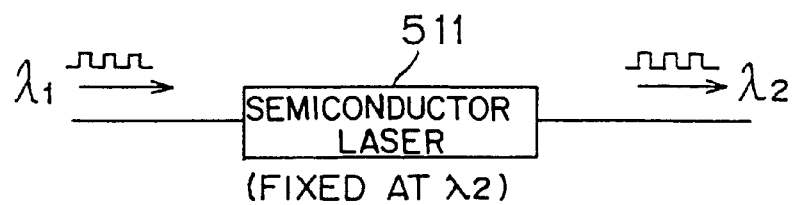
F I G. 1B

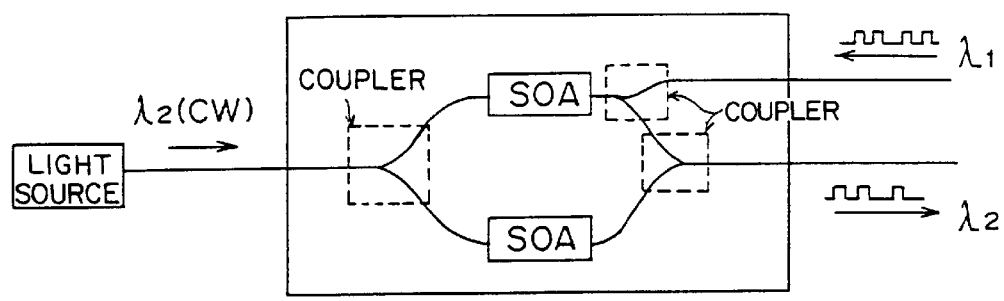
F I G. 2A
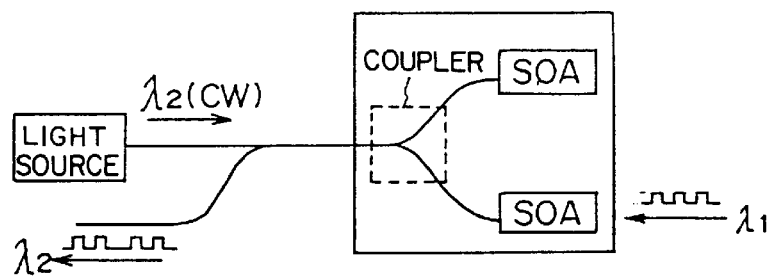
F I G. 2B

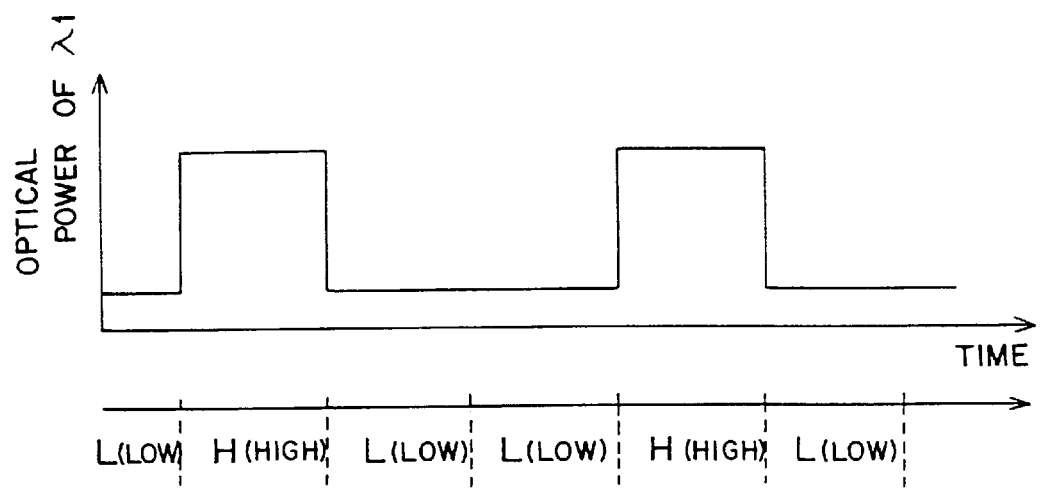
F I G. 5A
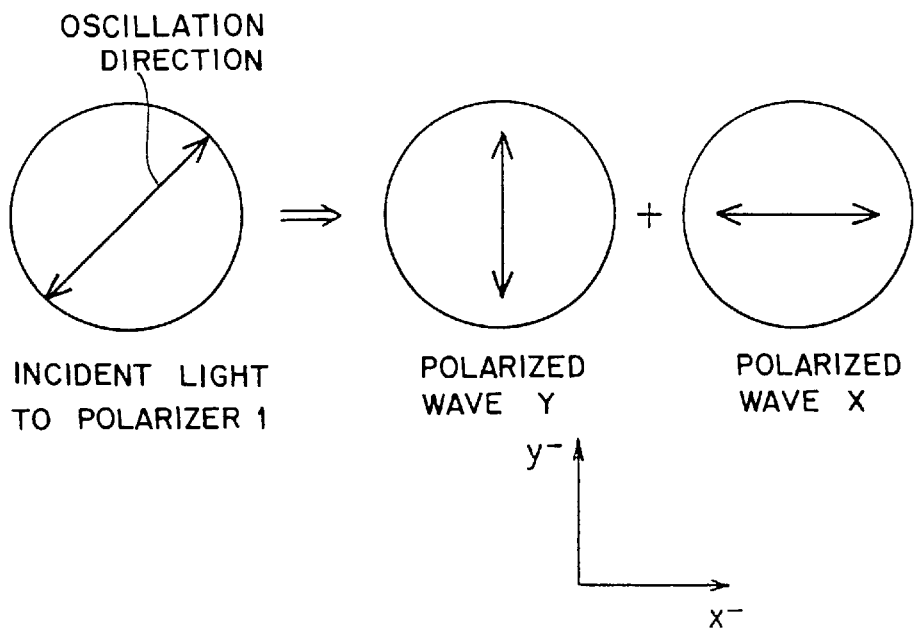
F I G. 5B

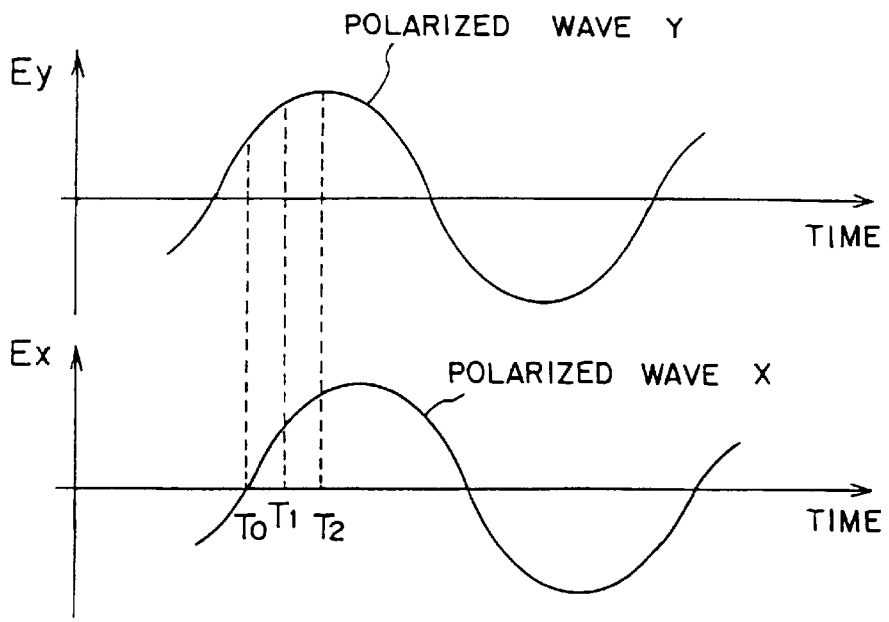
F I G. 6A
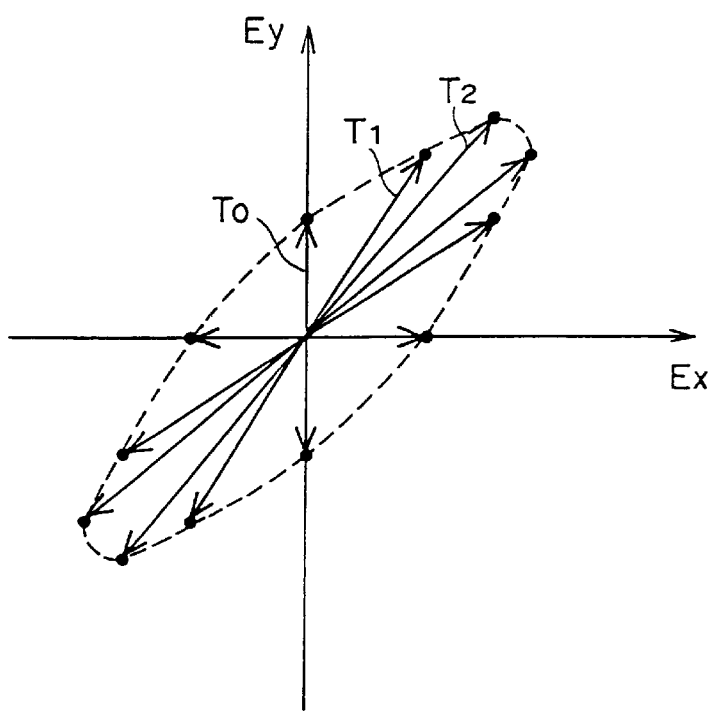
F I G. 6B

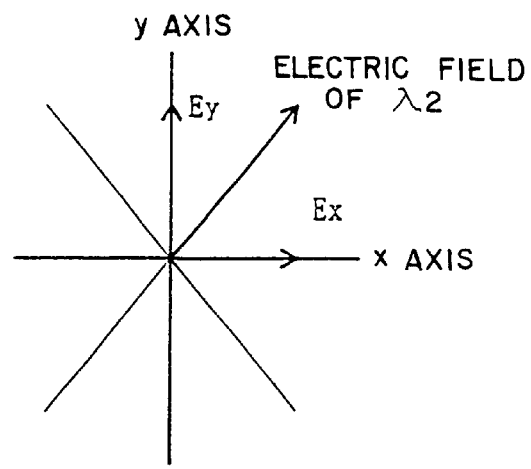
F I G. 10A
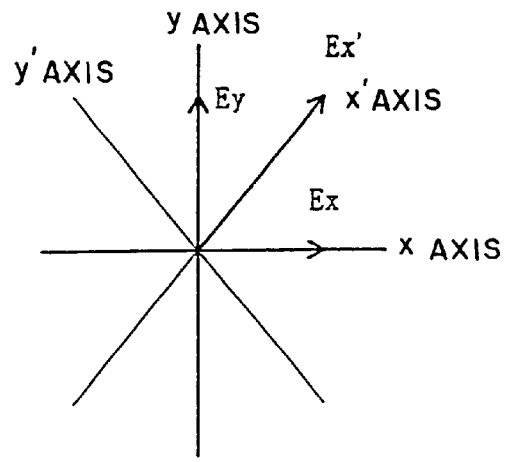
F I G. 10B
(WHEN Δφ = 0)
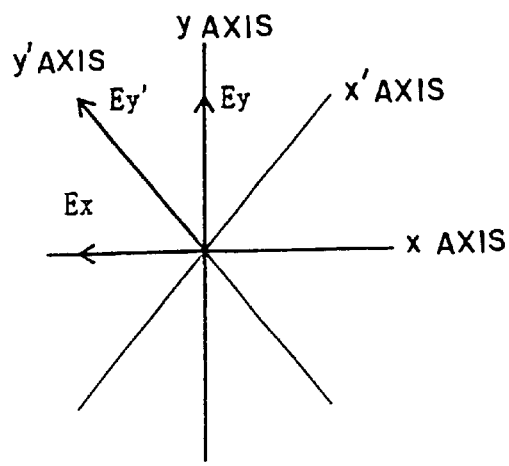
F I G. 10C
(WHEN Δφ = π)

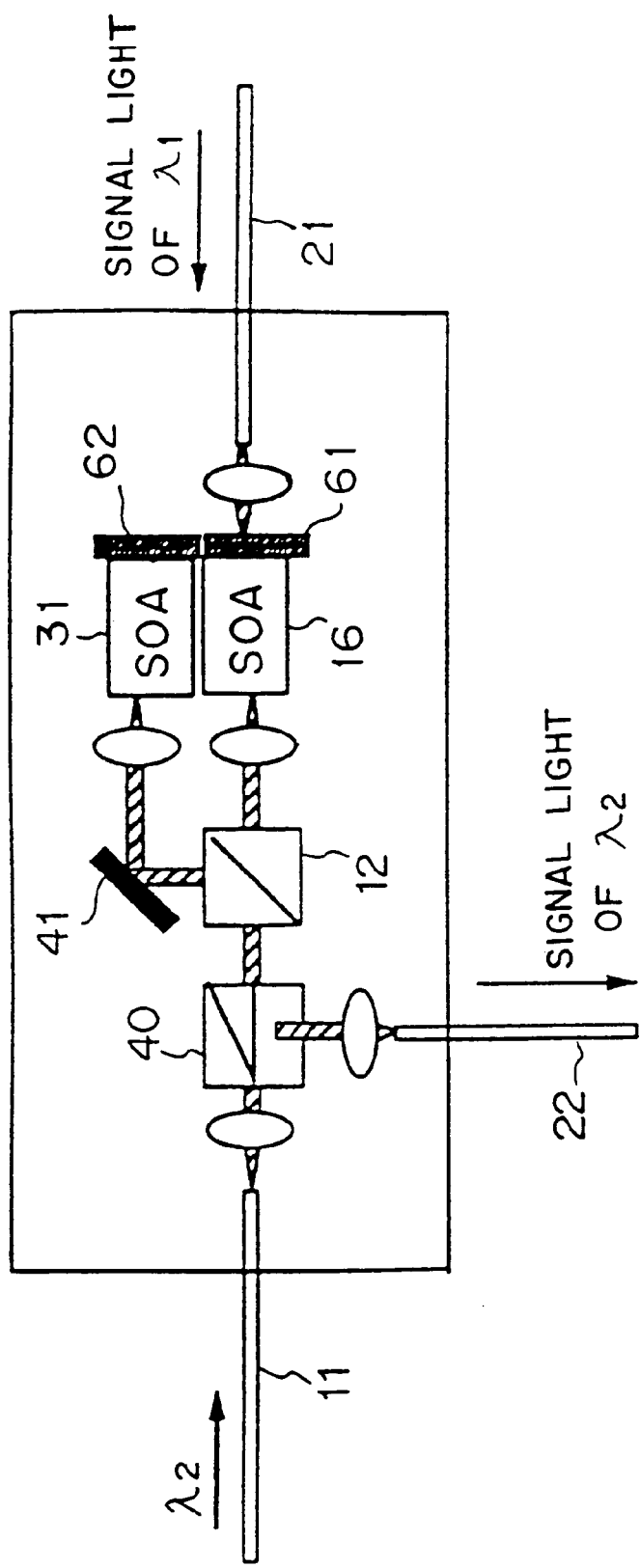
F I G. 19

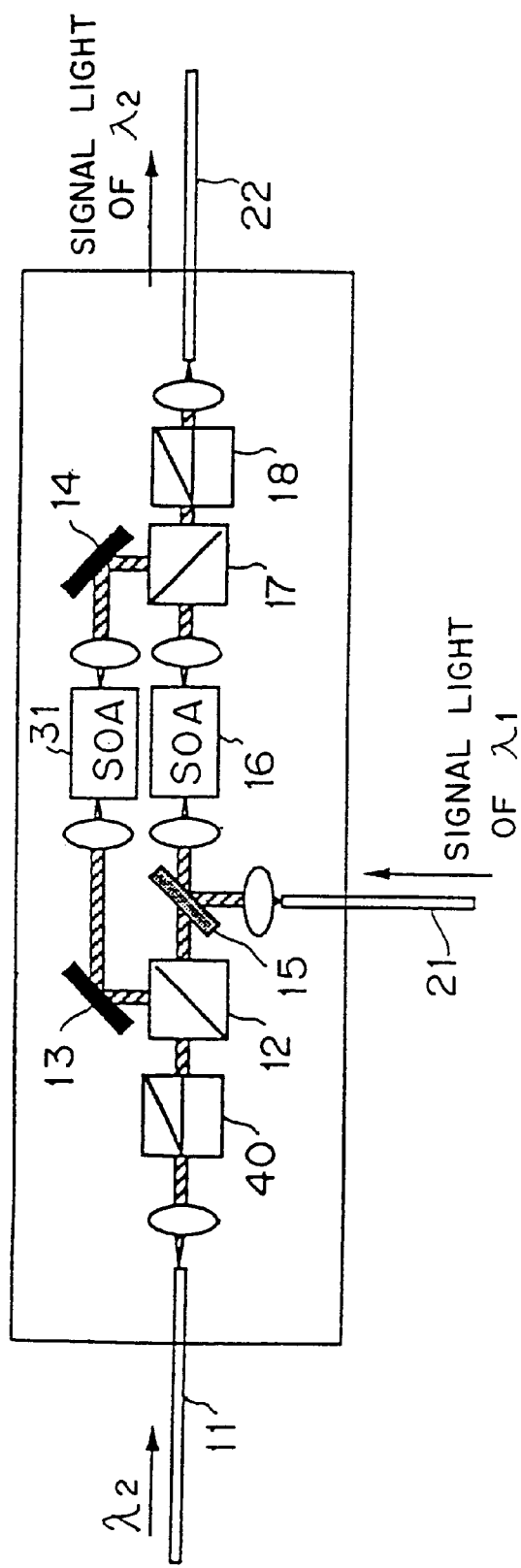
F I G. 25

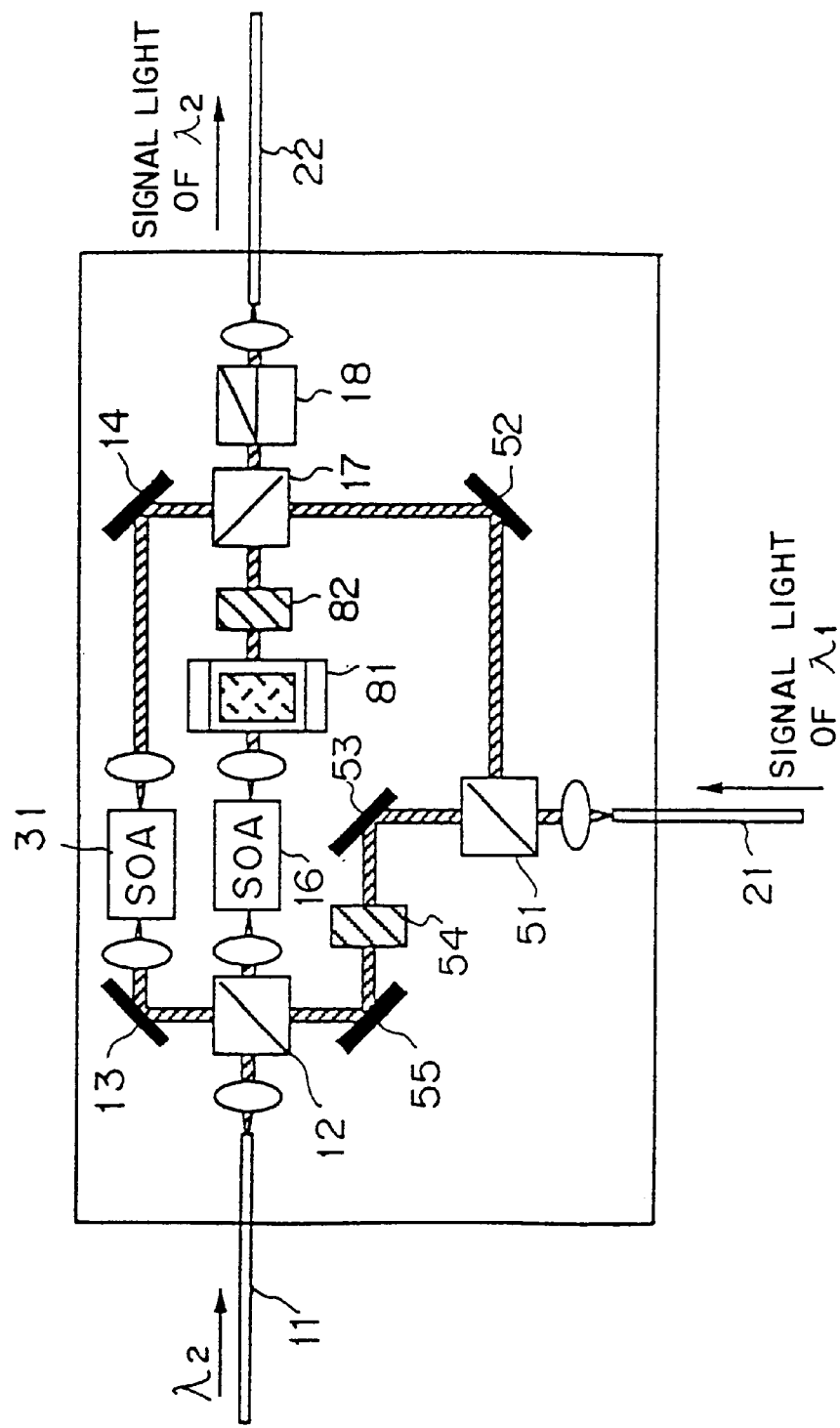
F I G. 32

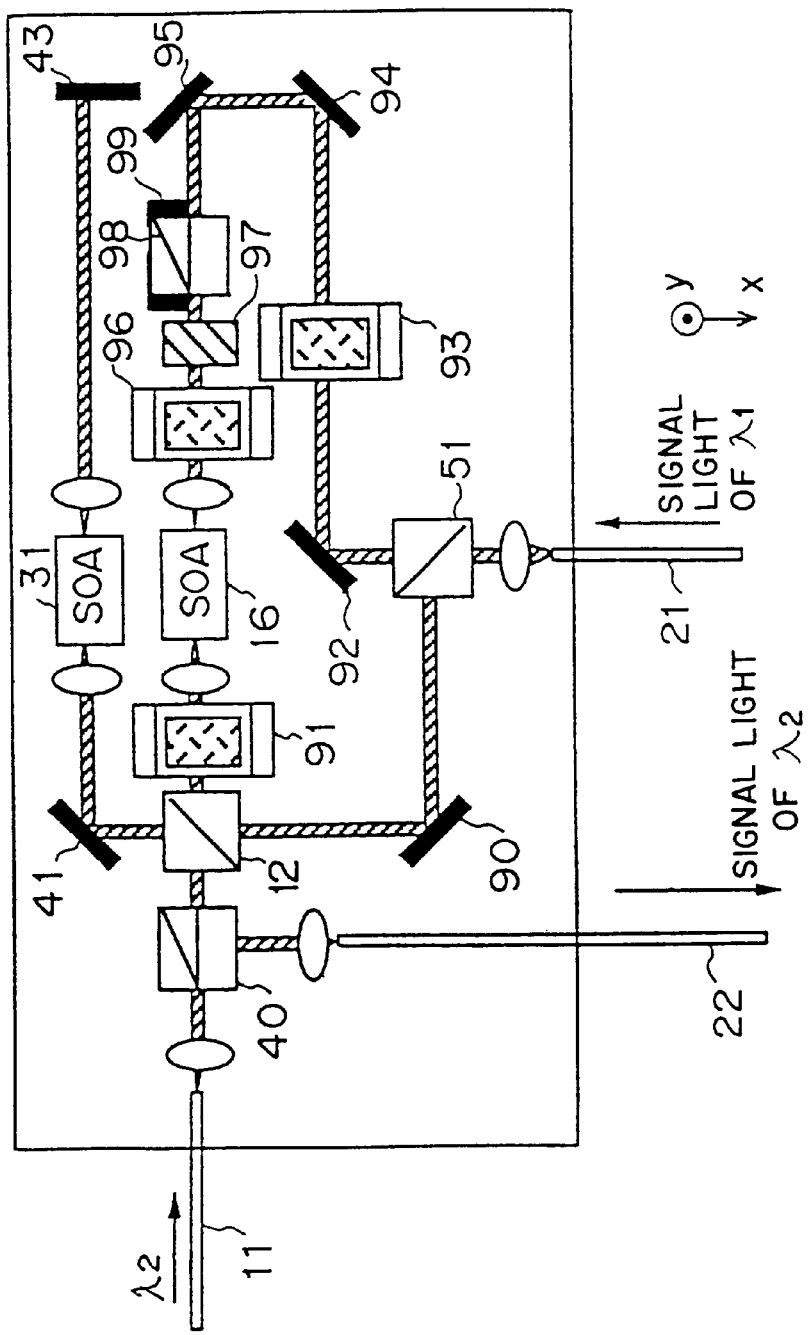
F I G. 34

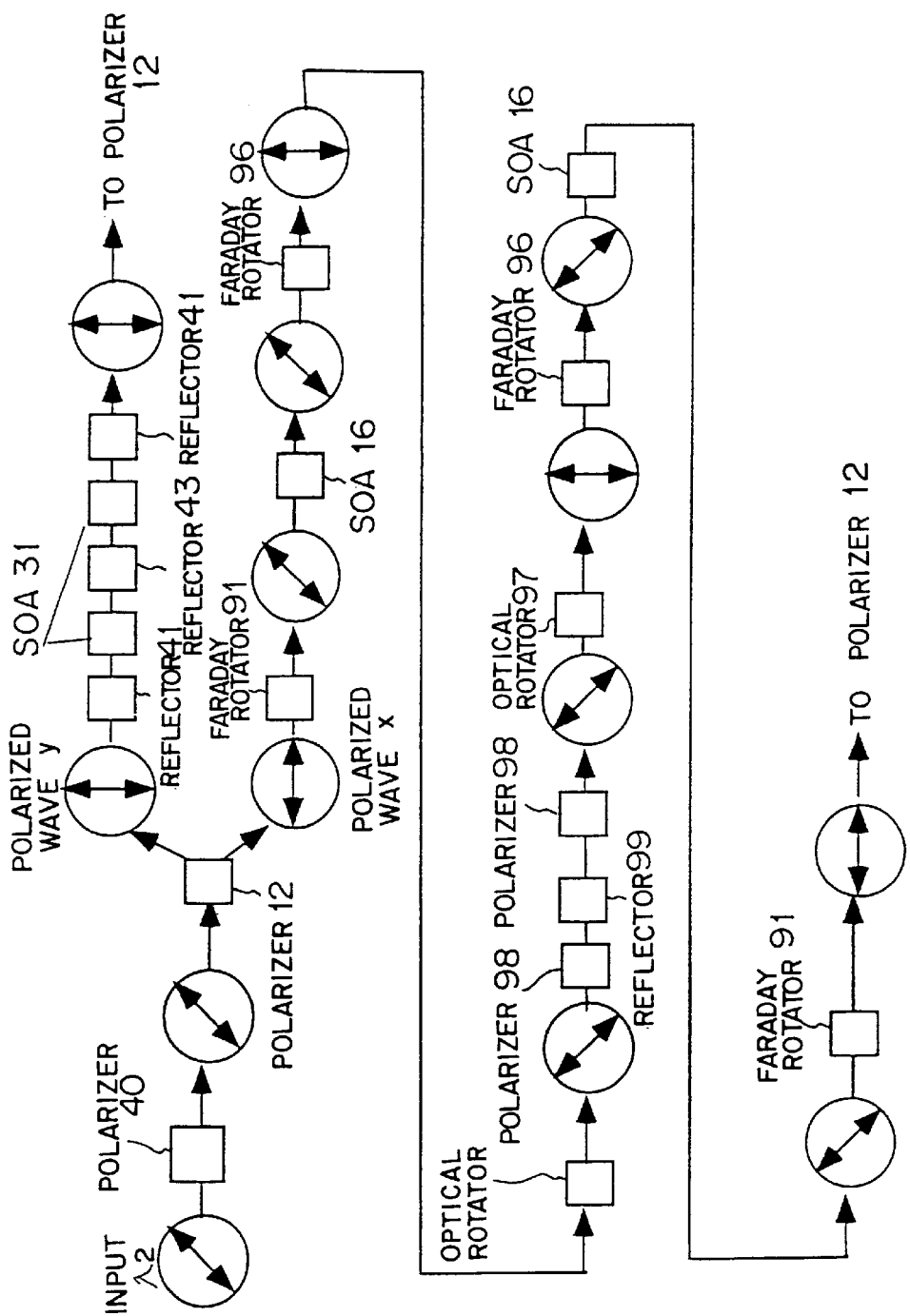
F I G. 36

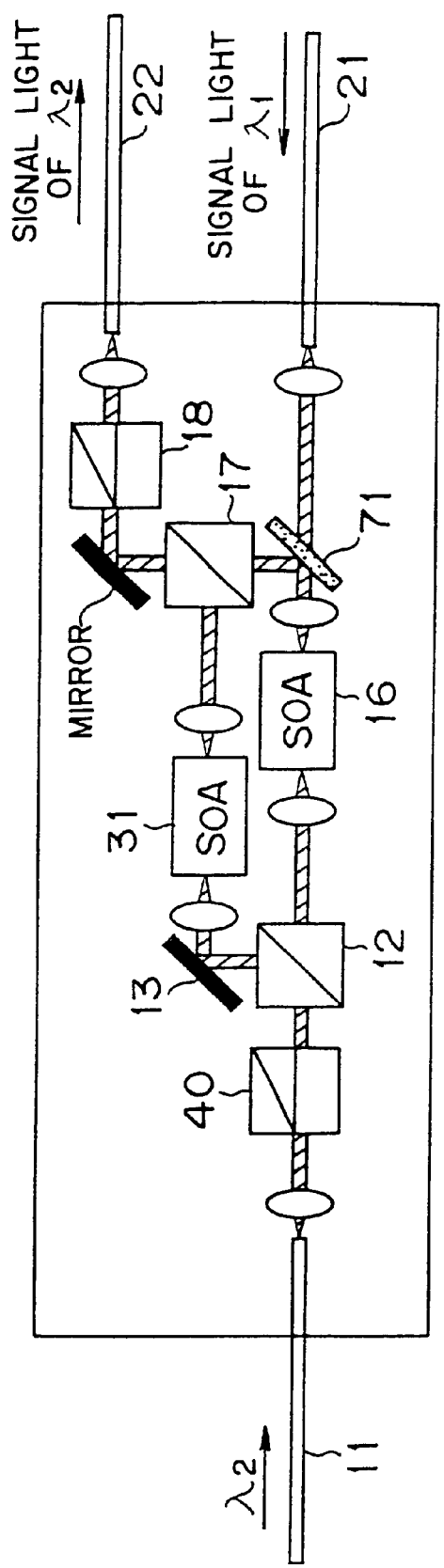
F I G. 39

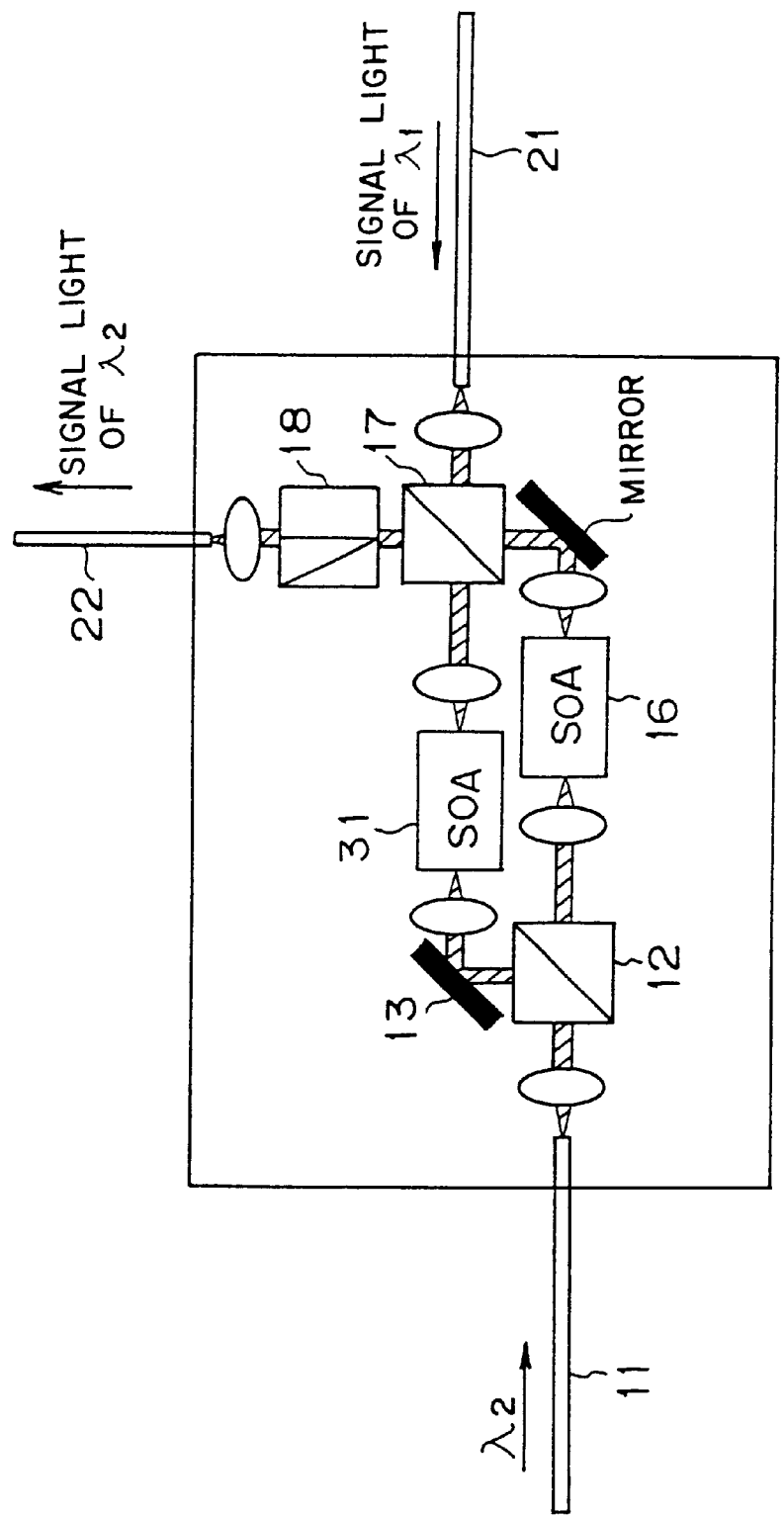
F I G. 41

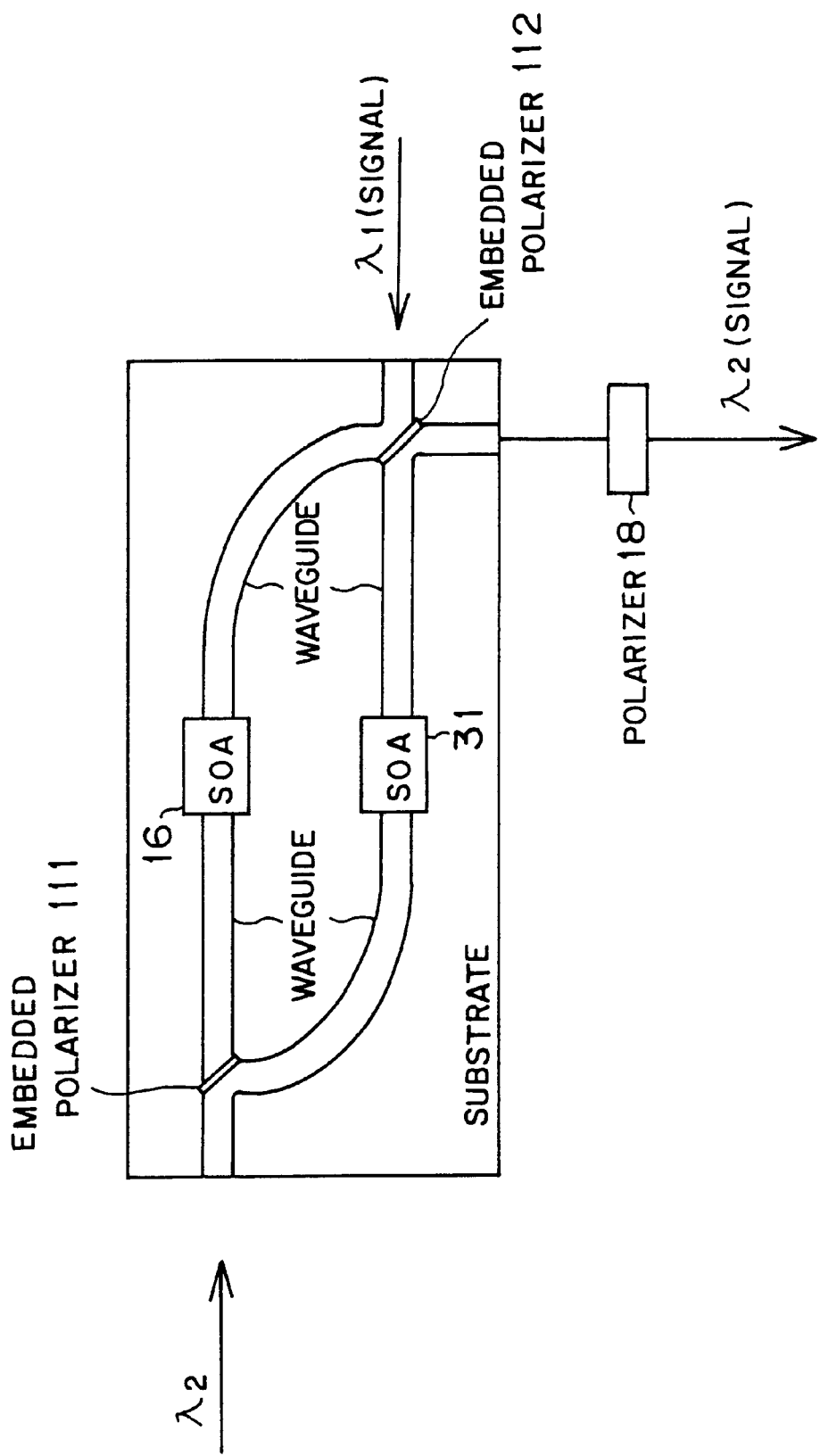
F I G. 43A

WAVELENGTH CONVERTER

BACKGROUND OF THE INVENTION

1. Field of the Invention

The present invention relates to a wavelength converter, and more specifically to a converter for converting the optical wavelength in transmitting a signal.

2. Description of the Related Art

Optical communications systems have become popular as networks for transmitting a large volume of information. In the optical communications systems, a signal is normally transmitted using a light having a specific wavelength. Recently, a transmission system based on a WDM (wavelength division multiplex) technology has attracted considerable attention. The WDM technology is realized by transmitting a plurality of signals through a single optical transmission line using different optical wavelengths.

A wavelength converter is used in, for example, a transmission system based on the above described WDM technology, and converts the wavelength of a light which transmits a signal. That is, the wavelength converter outputs a signal transmitted through a light having the wavelength $\lambda 1$ along the optical light having the wavelength $\lambda 2$. FIGS. 1 through 3 show examples of the existing wavelength converters.

FIG. 1A shows a wavelength converter based on a gain saturation effect of an input light in a semiconductor optical amplifier SOA (semiconductor optical amplifier). The modulation method based on the gain saturation effect is normally called a cross gain modulation (XGM). With this configuration, a light (input signal light) having the wavelength $\lambda 1$ intensity-modulated according to a transmission signal, and continuous waves (CW) having the wavelength $\lambda 2$ are input to a semiconductor optical amplifier 501 to obtain as an output from the semiconductor optical amplifier 501 a light having the wavelength $\lambda 2$ intensity-modulated according to the above described transmission signal. Thus, the wavelength of an input signal light is converted into the wavelength of an output light from a light source 502. That is, if a wavelength of the output light from the light source 502 is variable, then the wavelength of an input signal light can be converted into a desired wavelength.

FIG. 1B shows a wavelength converter based on the cross-gain modulation of a semiconductor laser. With this configuration, a semiconductor laser 511 for generating a light having the wavelength $\lambda 2$ based on the specific oscillation frequency is used. When a light having the wavelength $\lambda 1$ intensity-modulated according to a transmission signal is input to the semiconductor laser 511, the distribution of the wavelengths of the gain of the semiconductor laser 511 fluctuates. As a result, the oscillation light of the semiconductor laser 511 is intensity-modulated. That is, a light generated by the semiconductor laser 511 is intensity-modulated by an input signal light.

FIGS. 2A and 2B show a wavelength converter based on the cross phase modulation (XPM). With this configuration, two devices (for example, semiconductor optical amplifiers) whose refractive index and transmittance fluctuate depending on the input light intensity and the supplied electric current are used. The continuous wave having the wavelength $\lambda 2$ is input to the two devices, and the light (input signal light) having the wavelength $\lambda 1$ intensity-modulated according to a transmission signal is input to one of the devices. As a result, these two devices output the lights having the wavelength $\lambda 2$ with different phases. The phase difference depends on the intensity of an input signal light. Therefore, when the output from these two devices is coupled using an optical coupler, etc., the light having the wavelength $\lambda 2$ is intensity-modulated according to the input signal light having wavelength $\lambda 1$.

FIG. 3A shows a wavelength converter using a semiconductor laser and an interferometer. With this configuration, a semiconductor laser 521 for generating a light having the wavelength $\lambda 2$ is used. Then, a light having the wavelength $\lambda 1$ intensity-modulated according to a transmission signal is input to the semiconductor laser 521 to make the distribution of the wavelength of the gain of the semiconductor laser 521 fluctuate. As a result, the frequency of the output light from the semiconductor laser 521 can be modulated. After the output light passes through an optical band pass filter 522, the light is converted into an intensity modulated signal using an interferometer 523, for example, a Mach Zehnder interferometer, etc.

FIGS. 3B and 3C show a wavelength converter designed to convert an optical signal temporarily into an electric signal. With the configuration shown in FIG. 3B, a light having the wavelength $\lambda 1$ intensity-modulated according to a transmission signal is converted into an electric signal using an optical receiving element 531. The electric signal is a transmission signal, and is used to drive an emission element 532 for generating a light having the wavelength $\lambda 2$. Thus, the light having the wavelength $\lambda 2$ is intensity-modulated according to the transmission signal. With the configuration shown in FIG. 3C, continuous waves having wavelength $\lambda 2$ are generated using a light source 541, and the continuous waves are input to an optical modulator 542. Then, the light having the wavelength $\lambda 2$ is intensity-modulated by applying the electric signal obtained by the optical receiving element 531 to the optical modulator 542.

Reference Document:

(1) F. Masetti, et.al., "ATOMOS (ATM Optical Switching) : Results and Conclusions of the RACE R2039 project", Proc. 21st European Conference on Optical Communication ECOC'95 We. L. 1.7, 1995

(2) K. E. Stubkjaer, et.al., "Wavelength conversion devices and techniques", Proc. 22nd European Conference on Optical Communication ECOC'96, ThB. 2. 1, 1996

(3) C. Caspar, et.al., "Improvement of crosstalk tolerance in optical cross connects by regenerative frequency converter", Proc. 22nd European Conference on Optical Communication ECOC'96, ThD. 1.5, 1996

(4) W. Idler, et.al., "10 Gb/s wavelength conversion with integrated multiquantum-well-based 3-port Mach-Zehnder interferometer", IEEE Photon. Technol. lett., vol.8, pp. 1163–1165, 1996

(5) M. Shilling, et.al., "10 Gb/s monolithic MQW-based wavelength converter in Michelson interferometer configuration", Optical Fiber Communication (OFC'96) Technical Didest WG2, 1996

(6) C. Joergensen, et.al., "Up to 20 Gbit/s-rate transparent integrated interferometric wavelength converter", Proc. 22nd European Conference on Optical Communication ECOC'96, ThB. 2. 2, 1996

(7) H. Yasaka, et.al., "Repeated wavelength conversion of 10 Gb/s signal using wavelength tunable semiconductor lasers", IEEE Photon. Technol. Lett., vol.7, pp. 161–163, 1995

(8) K. Inoue, et.al., "Wavelength conversion using a light injected DFB-LD and a Mach-Zehnder filter with a ring resonator", IEEE Photon. Technol. Lett., vol.7, pp. 998–1000, 1995

However, it is difficult to improve the extinction ratio using the wavelength converter shown in FIGS. 1A and 1B. For example, to improve the extinction ratio using the wavelength converter shown in FIG. 1A, an optical amplifier and an intermediate light source are required and an adjustment of them is troublesome. Furthermore, since it requires an additional check process, there arises a problem of a bad yield and a high cost.

Since the wavelength converter shown in FIGS. 2A and 2B has an optical coupler to couple lights although it is able to improve the extinction ratio, there is a considerable optical loss in resultant wavelength ($\lambda 2$ in the above described example) after conversion.

With the wavelength converter shown in FIG. 3A, it is very difficult to adjust an interferometer and the resultant wavelength is fixed. Furthermore, with the wavelength converter shown in FIGS. 3B and 3C, it is hard to realize a smaller and less expensive system.

SUMMARY OF THE INVENTION

The present invention aims at solving the above described conventional problems and providing a wavelength converter with a small optical loss and a high extinction ratio at a lower cost.

The wavelength converter according to the present invention is based on the configuration designed to receive an intensity-modulated signal light having a first wavelength, and output a signal light having a second wavelength which is modulated according to the modulated state of the input signal light having the first wavelength. The wavelength converter according to the present invention includes a first polarizer for separating an incident light having the second wavelength into a first and second polarized waves normal to each other; a waveguide for guiding the first polarized wave; a coupling device for coupling the output wave from the waveguide and the second polarized wave; and a second polarizer for receiving the output light from the coupling device and outputting the signal light having the second wavelength. The above described waveguide changes its refractive index depending on the intensity of an input light, and receives the signal light having the first wavelength.

With the above described configuration, the phase delay of the first polarized wave generated by passing through the waveguide depends on the intensity of the signal light having the first wavelength. Therefore, the polarized state of the light coupled by the coupling device also depends on the intensity of the signal light having the first wavelength. As a result, the intensity of the output light from the second polarizer depends on the intensity of the signal light having the first wavelength. The first and second polarized waves coupled by the coupling device are both lights having the second wavelength. Therefore, the output light from the second polarizer has the second wavelength and has been modulated depending on the intensity of the signal light having the first wavelength.

BRIEF DESCRIPTION OF THE DRAWINGS

FIGS. 1A and 1B show examples (1) of the conventional wavelength converter;

FIGS. 2A and 2B show examples (2) of the conventional wavelength converter;

FIG. 5A shows the signal light input to a waveguide;

FIG. 5B shows the input/output to and from a polarizer;

FIG. 6A shows the phases (having an optional phase difference) of polarized waves normal to each other;

FIG. 6B shows the output from the coupling device corresponding to FIG. 6A;

FIGS. 10A through 10C supplementarily show the principle of the present invention;

FIGS. 11 through 34 show the configurations of the first through twenty-fourth embodiments of the present invention;

FIG. 36 shows the polarized state of the signal light having the wavelength $\lambda 2$ according to the twenty-fourth embodiment;

FIGS. 37 through 41 show the configurations of the twenty-fifth through twenty-ninth embodiments of the present invention;

FIGS. 43A and 43B show embodiments of a wavelength converter whose waveguide has an embedded polarizer.

DETAILED DESCRIPTION OF THE INVENTION

Figure 3A:
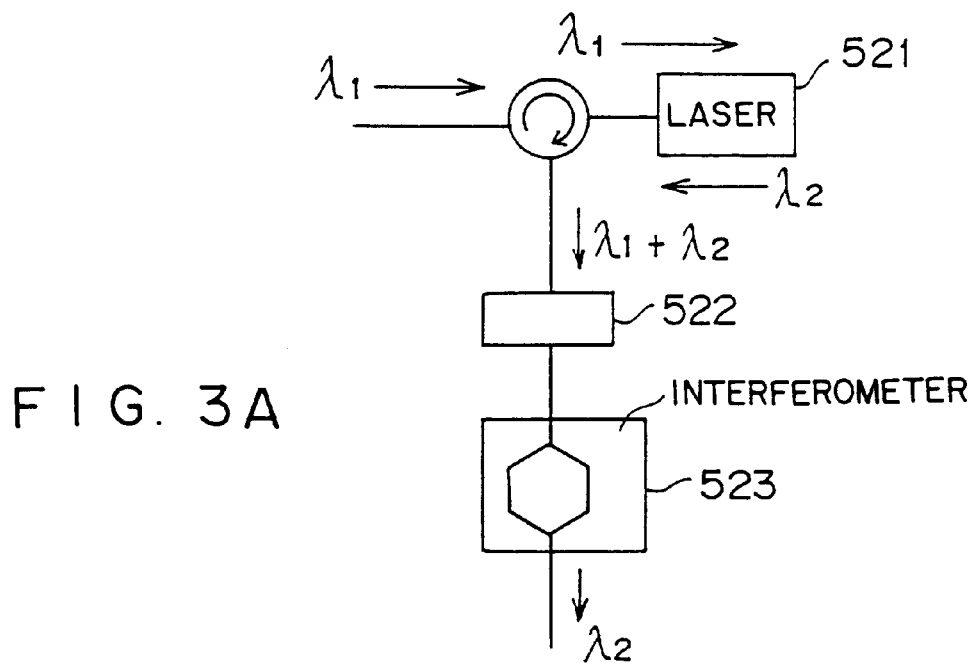
FIGS. 3A, 3B and 3C show examples (3) of the conventional wavelength converter.
Figure 3B:
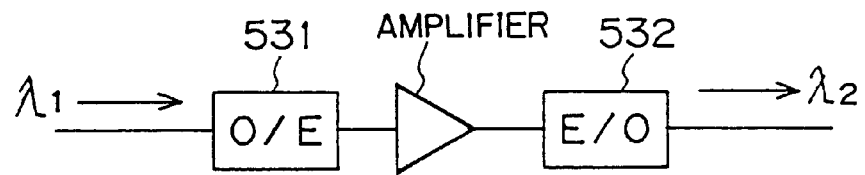
Figure 3C:
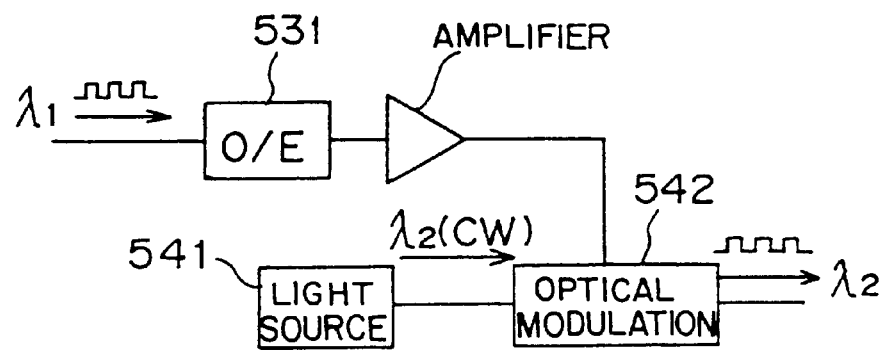
Figure 4:
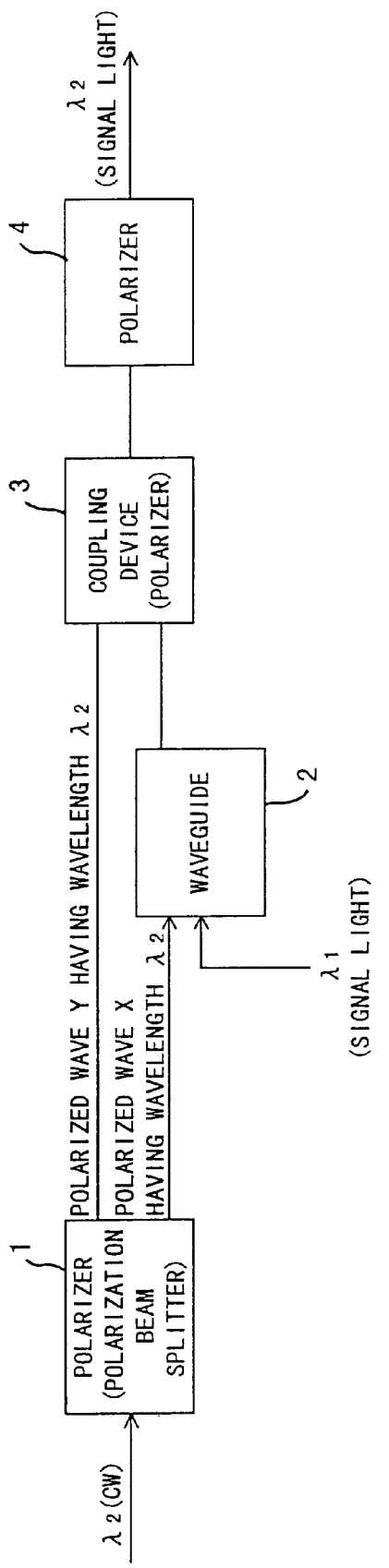
FIG. 4 show the principle of the present invention.

FIG. 4 shows the principle of the present invention. In this example, the wavelength converter receives a signal light, which is intensity-modulated according to a transmission signal and has a wavelength $\lambda 1$, and outputs the transmission signal using a light having a wavelength $\lambda 2$. That is to say, the wavelength converter of this embodiment converts a signal light having wavelength $\lambda 1$ into a signal light having wavelength $\lambda 2$.

A polarizer 1 generates two linearly polarized waves (X polarized wave and Y polarized wave), which are normal to each other, from an input light having a wavelength $\lambda 2$. The input light having the wavelength $\lambda 2$ is assumed to be a linearly polarized wave. The input light having the wavelength $\lambda 2$ is assumed not to be intensity-modulated at least in the band of the transmission signal transmitted through a signal light having the wavelength $\lambda 1$. In this case, the input light having the wavelength $\lambda 2$ is a continuous wave or a nearly continuous wave. One of the output from the polarizer 1 (X polarized wave) is input to the waveguide 2, and the other (Y polarized wave) is input to a coupling device 3.

A waveguide 2 contains a material whose refractive index depends on the intensity of an incident light, receives a signal light having the wavelength λ1 and an X polarized wave, and guides them. As it is well known, the velocity of the light propagated through a waveguide changes correspondingly to the change in refractive index of the waveguide. Therefore, the delay time recorded by the light passing through the waveguide 2 changes depending on the intensity of the signal light having the wavelength λ1 and the X polarized wave. Since the X polarized wave is generated from continuous waves, the intensity is constant. Therefore, the delay time recorded by the light passing through the waveguide 2 changes depending on the intensity of the signal light having the wavelength λ1. The output from the waveguide 2 is input to the coupling device 3. There can be an optical filter, provided between the waveguide 2 and the coupling device 3 or provided after coupling device 3, for passing only the wavelength λ2.

The coupling device 3 couples the X polarized wave which has passed through the waveguide 2 with the Y polarized wave output from the polarizer 1. The coupling device 3 comprises, for example, a polarizer. The output light from the coupling device 3 is input to a polarizer 4.

The polarizer 4 is set to make a predetermined angle with a plane of polarization of a light output from the coupling device 3 when the phase of an X polarized wave and the phase of a Y polarized wave input to the coupling device 3 indicates a specific relationship. For example, the polarizer 4 is set to make the same angle as the angle of the plane of polarization of the light output from the coupling device 3 when the phases of the X and Y polarized waves match each other. In this case, when the coupling device 3 is a polarizer, the polarizer 4 is set by rotating it, centering on the direction of the passing light, to make 45 or 135 degrees with the polarizer as the coupling device 3. The polarizer 4 separates the output light from the coupling device 3 into two polarized waves normal to each other.

The polarizer 1, coupling device 3, and polarizer 4 contain, for example, a birefringence material or a multi-layer polarization separating filter. The waveguide 2 is, for example, a semiconductor optical amplifier.

With the above described configuration, since the signal light having the wavelength λ1 is intensity-modulated according to a transmission signal, the refractive index of the waveguide 2 changes depending on the transmission signal, and the delay time recorded by the passage of a light through the waveguide 2 also changes depending on the transmission signal. As a result, the phase of the X polarized wave input to the coupling device 3 after passing through the waveguide 2 changes depending on the above described transmission signal. The phase of the Y polarized wave is independent of the above described transmission signal.

When the phase of the X polarized wave changes, the element of the output light from the coupling device 3 in the X direction changes correspondingly. If the element of the output light from the coupling device 3 in the X direction changes, then the element of each output light from the polarizer 4 changes. That is, the intensity of each output light from the polarizer 4 changes depending on the above described transmission signal, and the output light from the polarizer 4 is intensity-modulated according to the transmission signal transmitted along the signal light having the wavelength λ1, and its wavelength is λ2.

FIG. 5A shows a signal light which has the wavelength λ1 and is input to the waveguide 2. This signal light is intensity-modulated according to a transmission signal. In FIG. 5A, a high-intensity state corresponds to an 'H' state of the transmission signal whereas a low-intensity state (or an extinct state) corresponds to an 'L' state of the transmission signal.

FIG. 5B shows the input/output of the polarizer 1. The incident light having the wavelength λ2 is assumed to be a linearly polarized wave. In FIG. 5B, the light passes in the direction perpendicular to the plane of FIG. 5B, and the arrow indicates the vibration direction of the electrical field. The polarizer 1 separates the incident light into the X and Y polarized waves normal to each other. When the polarizer 1 comprises a birefringence material, the a X polarized wave and the Y polarized wave can be obtained as a normal light and an abnormal light. According to the present invention, the incident light having the wavelength λ2 does not necessarily have to be a linearly polarized wave, but the X and Y polarized waves normal to each other can be generated from an incident light in a stably polarized state in a signal band. However, according to the following embodiment, it is assumed that the incident light having the wavelength λ2 is a linearly polarized wave.

Of the generated X polarized wave and Y polarized wave, one (X polarized wave) is input to the coupling device 3 after passing through the waveguide 2, and the other (Y polarized wave) is input as is to the coupling device 3.

Figure 7A:
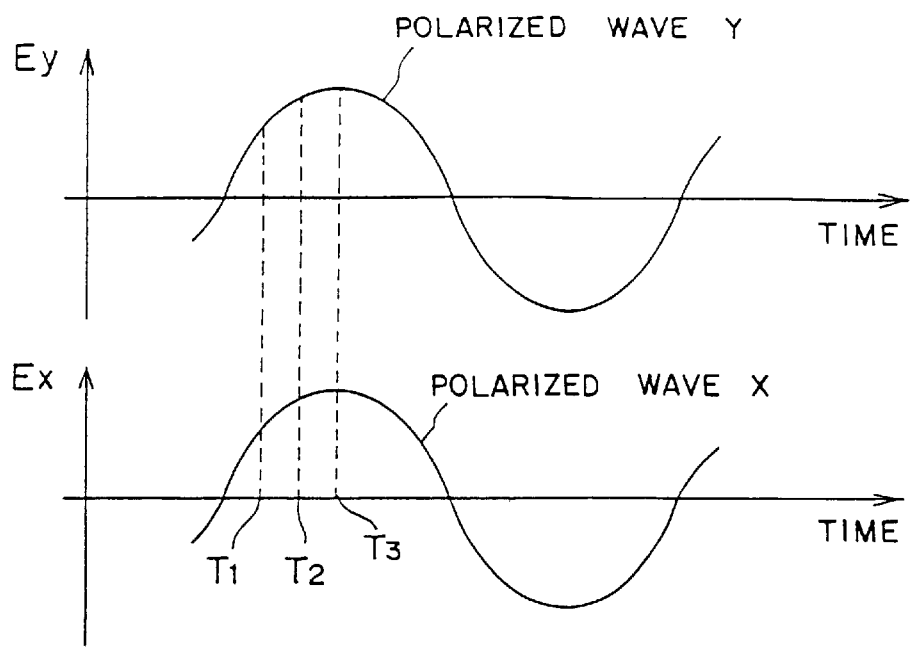
FIG. 7A shows the phases (phase difference=0) of polarized waves normal to each other.
Figure 8A:
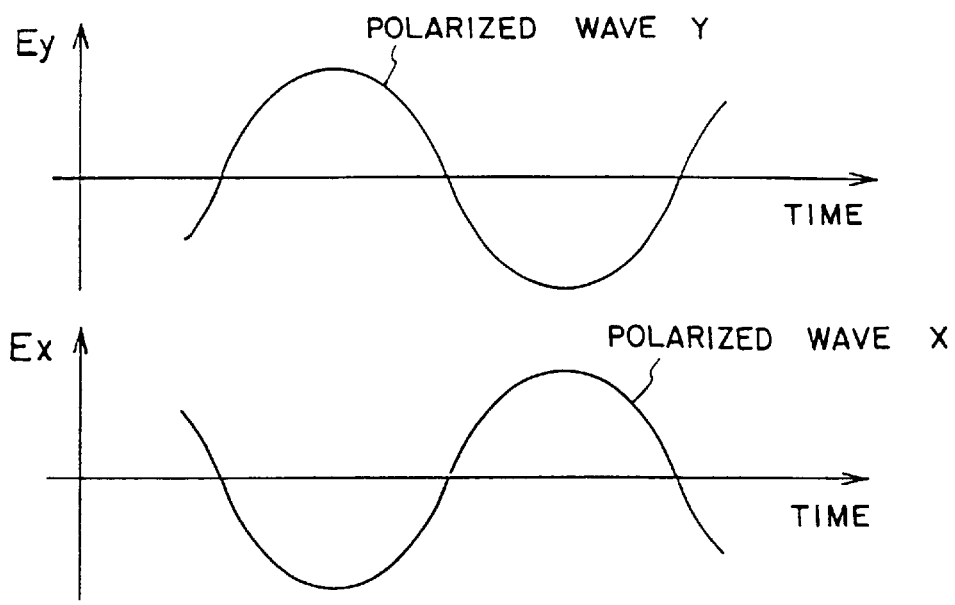
FIG. 8A shows the phase (phase difference=$\pi$) of the polarized waves normal to each other.

FIGS. 6A, 7A, and 8A show the relationship of the phases between the X polarized wave and the Y polarized wave input to the coupling device 3. FIG. 6A shows the state in which the phases of the X polarized wave and the Y polarized wave are different by π/6 from each other. FIG. 6B shows the polarized state of the output light from the coupling device 3 when the relationship of the phases between the X polarized wave and the Y polarized wave is in the state shown in FIG. 6A. The electric field vector of the output light from the coupling device 3 is obtained as a sum of the electric field vectors of the X polarized wave and the Y polarized wave input to the coupling device 3. Thus, when the phases of the X polarized wave and the Y polarized wave are different from each other, the output light from the coupling device 3 is not a linearly polarized wave.

The phase of the X polarized wave output from the waveguide 2 changes depending on the intensity of the signal light having wavelength λ1 which is input to the waveguide 2 as described above. According to the present embodiment, the amount of delay in the waveguide 2 is adjusted in such a way that the phases of the X and Y polarized waves received by the coupling device 3 match each other when the intensity of the signal light having the wavelength λ1 is low (or in the extinctive state). It is desired that, in addition to the above described condition, the amount of delay in the waveguide 2 is adjusted in such a way that the phases of the X and Y polarized waves received by the coupling device 3 are different by π from each other when the intensity of the signal light having the wavelength λ1 is high. The amount of delay in the waveguide 2 can be adjusted by controlling the electric current supplied to a semiconductor optical amplifier when the waveguide 2 comprises the semiconductor optical amplifier. FIGS. 7A and 8A show the state in which the phases of the X and Y polarized waves match each other and the state in which the phases are different by π from each other respectively.

Figure 7B:
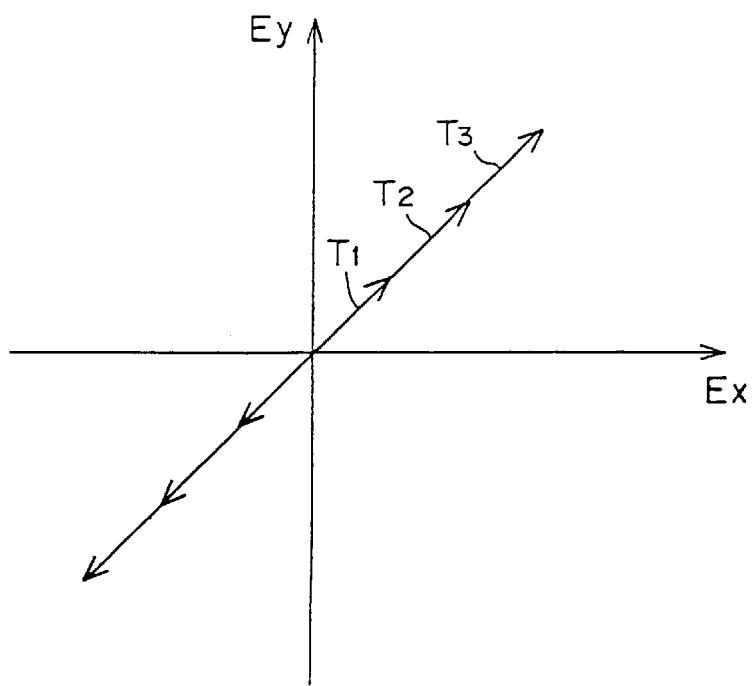
FIG. 7B shows the output from the coupling device corresponding to FIG. 7A.

When the phases of the X and Y polarized waves match each other in the coupling device 3, the electric field of the output light from the coupling device 3 oscillates counter-clockwise by 45 degrees about the X axis (oscillation direction of the electric field of the X polarized wave) as shown in FIG. 7B. That is, in this case, the output light from the coupling device 3 is a linearly polarized wave rotated counterclockwise by 45 degrees about the X axis.

Figure 8B:
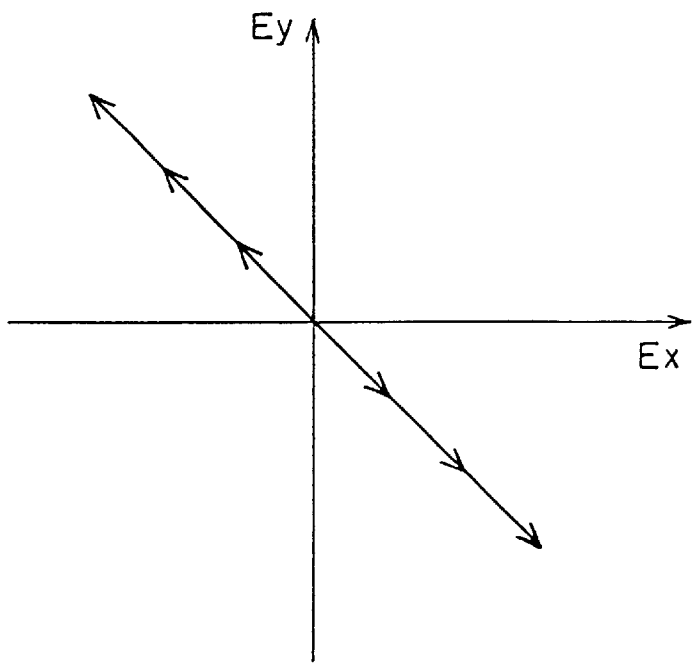
FIG. 8B shows the output from the coupling device corresponding to FIG. 8A.

On the other hand, when the phases of the X and Y polarized waves are different by n from each other in the coupling device 3, the electric field of the output light from the coupling device 3 oscillates counterclockwise by 135 degrees about the X axis as shown in FIG. 8B. That is, in this case, the output light from the coupling device 3 is a linearly polarized wave rotated counterclockwise by 135 degrees about the X axis.

Thus, with the wavelength converter according to the present embodiment, the coupling device 3 outputs a linearly polarized wave rotated by 45 degrees about the X axis when the intensity of the signal light having the wavelength λ1 is low, or the transmission signal indicates 'L'. When the intensity of the signal light having the wavelength λ1 is high, that is, the transmission signal indicates 'H', the coupling device 3 outputs a linearly polarized wave rotated by 135 degrees about the X axis. The coupling device 3 couples the X and Y polarized waves generated from the incident light having the wavelength λ2, and outputs the result. Therefore, the wavelength of the output light from the coupling device 3 is λ2. The output light from the coupling device 3 possibly contains λ1, but it is assumed that a wavelength filter, etc. has cut it.

According to the present embodiment, the polarizer 4 is set as rotated by 45 degrees about the X axis. Therefore, the coordinate system (X'–Y' coordinate system) in the polarizer 4 is obtained by rotating the above described X-Y coordinate system by 45 degrees. The polarizer 4 separates the incident light into the elements in the X' and Y' directions, and outputs the result.

Therefore, when the X and Y polarized waves whose phases match each other are input to the coupling device 3, the polarizer 4 outputs only the polarized wave in the X' direction, and the element in the Y' direction is 0. That is, when the intensity of the signal light having the wavelength λ1 is low, the polarizer 4 outputs only the polarized wave in the X' direction, but the element in the Y' direction is 0. When the X and Y polarized waves whose phases are different by π from each other are input to the coupling device 3, the polarizer 4 outputs only the polarized wave in the Y' direction, and the element in the X' direction is 0. That is, when the intensity of the signal light having the wavelength λ1 is high, the polarizer 4 outputs only the polarized wave in the Y' direction, but the element in the X' direction is 0.

According to the present embodiment, of the two polarized waves (polarized waves in the X' and Y' directions) output from the polarizer 4, the polarized wave in the X' direction is assumed to be output from the wavelength converter. With the above described configuration, when the intensity of the signal light having the wavelength λ1 is low, the polarizer 4 outputs only the polarized wave in the X' direction. On the other hand, when the intensity of the signal light having the wavelength λ1 is high, the polarizer 4 outputs only the polarized wave in the Y' direction. That is, the output light from the polarizer 4 is a signal light having wavelength λ2 modulated into an inverse state from the state of the signal light having the wavelength λ1.

In the above described example, the incident light having the wavelength λ2 is a linearly polarized wave. However, a roughly linear polarization (close to the linear polarization), even if it is not perfectly linear polarization, can be applied to the modulation of the light having the wavelength λ2 in the modulation state of the signal light having the wavelength λ1 in the similar operations. In the above described example, it is assumed that the phase differences are 0 and π between the X and Y polarized waves having wavelength λ2 when the signal light having the wavelength λ1 indicates the L and H levels respectively. Even if the above listed conditions are not satisfied, the light having the wavelength λ2 can be modulated according to the modulation state of the signal light having the wavelength λ1 in the similar operations as long as the polarized wave having wavelength λ2 is stable in time. In the above described example, the polarizer 4 is set as rotated by 45 degrees about the X axis, but can be set as rotated by 135 degrees. Furthermore, it can be set in such a way that the phase difference is π between the X and Y polarized waves when the signal light having the wavelength λ1 is the L level.

The operations of the above described wavelength converter are additionally described as follows by referring to FIGS. 10A through 10C. FIG. 10A shows the polarized wave having the wavelength λ2 when it is input to the coupling device 3 based on the X and Y axes shown in FIG. 5B. FIGS. 10B and 10C show the polarized wave having the wavelength λ2 when the coupling device 3 outputs the polarized wave.

Assuming that the electric field element parallel with the X axis is Ex, the electric field element parallel with the Y axis is Ey, the phase difference generated by a signal light having the wavelength λ1 in the waveguide 2 is Δφ, and the loss in the optical coupling and in the polarizer is ignored, the electric fields Ex and Ey are represented as follows.

$$Ex = \sqrt{2}/2 \cdot \sqrt{T} \cdot E0 \cdot \cos(wt + \theta + \Delta\phi)$$

$$Ey = \sqrt{2}/2 \cdot \sqrt{T} \cdot E0 \cdot \cos(wt + \theta)$$

where E0 indicates the electric field intensity of the light having the wavelength λ2, ω indicates the angular frequency of the light having the wavelength λ2, t indicates time, θ indicates a phase delay, and T indicates the transmittance of the waveguide 2. Here, the transmittance of the Ey polarized light is adjusted to T.

Assuming that the X' and Y' axes are in the same directions as the planes of polarization of the two polarized waves output from the polarizer 4 in FIGS. 10B and 10C, the electric field Ex' parallel with the X' axis is represented as follows.

$$Ex' = \sqrt{T} \cdot E0 \cos(\omega t + \theta) \text{ when } \Delta\phi/2 = 0$$

$$Ex' = 0 \text{ when } \Delta\phi/2 = \pi/2$$

Thus, the element in the X' axis direction of the output light from the polarizer 4 indicates the maximum value when the phase difference Δφ generated in the waveguide 2 when a signal light having the wavelength λ1 is input is 0, and indicates the minimum value when the phase difference Δφ is π. The intensity Sout of the light having wavelength λ2 which is output from the wavelength converter is represented as follows when the loss at the polarizers 1 and 4, and the coupling device 3 is ignored.

$$Sout \, [Ex']^2 \, T \cdot [E0 \cdot \cos(\omega t + \theta + \Delta\phi/2) \cdot \cos(\Delta\phi/2)]^2$$

Described below is a practical configuration of the wavelength converter according to the present invention.

Figure 11:
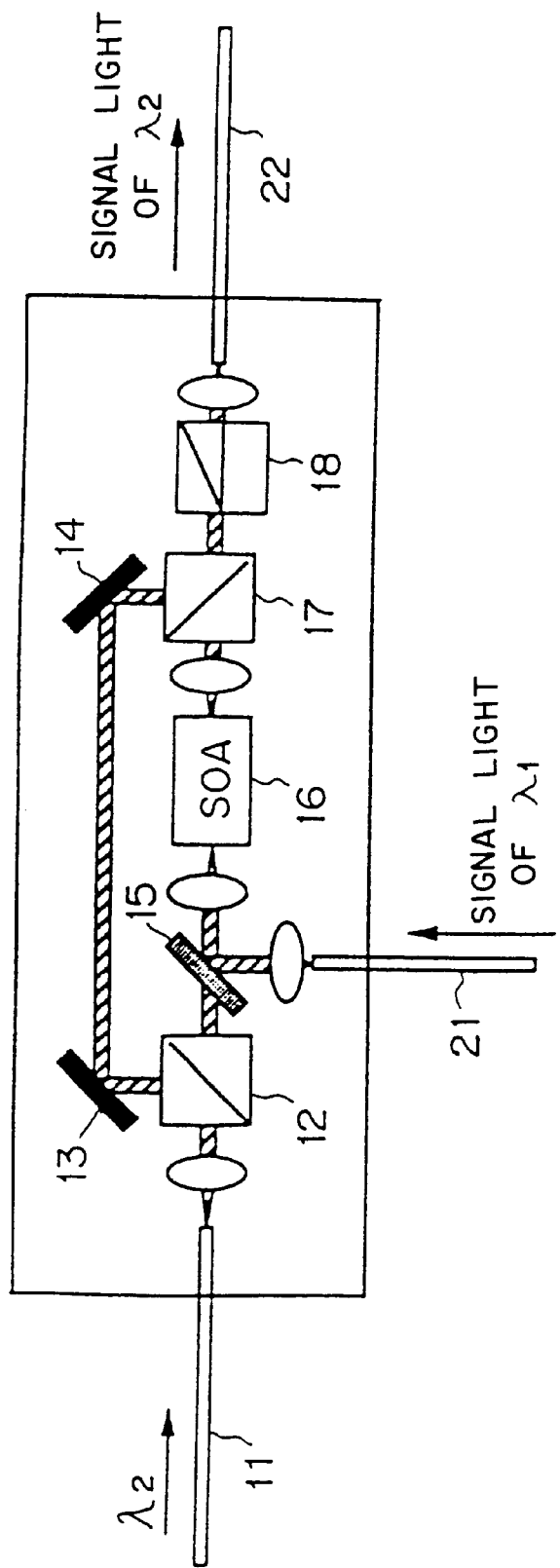

FIG. 11 shows the configuration according to the first embodiment of the present invention. The incident light which has the wavelength λ2 and input through an optical fiber 11 is a linearly polarized wave. In this case, the optical fiber 11 can be a polarization-maintaining fiber. It is assumed that the incident light is, at least, not intensity-modulated in the band of a transmission signal which is transmitted by a signal light having wavelength λ1. For example, continuous waves are used as incident lights having the wavelength λ2.

The incident lights are separated by a polarizer 12 into two polarized waves normal to each other. The two polarized wave are referred to as an X polarized wave and a Y polarized wave. FIG. 5B shows the method of generating the polarized waves X and Y.

The Y polarized wave generated by the polarizer 12 is led to a polarizer 17 by reflecting devices 13 and 14. On the other hand, the X polarized wave passes through a half mirror 15 and a semiconductor optical amplifier 16, and is led to the polarizer 17. The semiconductor optical amplifier 16 contains a waveguide whose refractive index changes depending on the intensity of an incident light and supplied electric current. Therefore, if the intensity of the incident light to the semiconductor optical amplifier 16 changes, then the amount of the phase delay recorded when the light passes through the semiconductor optical amplifier 16 changes correspondingly. Furthermore, the amount of the phase delay recorded when the light passes through the semiconductor optical amplifier 16 can be adjusted by controlling the electric current supplied to the semiconductor optical amplifier 16.

The amount of phase delay $\Delta\phi$ recorded when the light having the wavelength $\lambda 2$ passes through the semiconductor optical amplifier 16 is represented by the following equation.

$$\Delta\phi (2\pi L/\lambda 2)\cdot(dn/dN)\cdot(dN/dP)\cdot\Delta P$$

where L indicates the optical path of the semiconductor optical amplifier 16, n indicates the effective refractive index of the active layer of the semiconductor optical amplifier 16, N indicates the electron density of the active layer of the semiconductor optical amplifier 16, P indicates the input optical power to the semiconductor optical amplifier 16. In the equation above, P changes with the power of the incident light to the semiconductor optical amplifier 16, and N changes with the electric current supplied to the semiconductor optical amplifier 16. Therefore, the amount of phase delay $\Delta\phi$ recorded when the light having the wavelength $\lambda 2$ passes through the semiconductor optical amplifier 16 changes with the power of the incident light to the semiconductor optical amplifier 16 and with the electric current supplied to the semiconductor optical amplifier 16.

The signal light having wavelength $\lambda 1$ which is intensity-modulated according to a transmission signal is input through an optical fiber 21. In this example, binary intensity modulation is used as a modulation system. This signal light is led to the semiconductor optical amplifier 16 by the half mirror 15. Therefore, the amount of delay in the semiconductor optical amplifier 16 changes with the intensity (low/high level represented by binary modulation) of the signal light.

The amount of delay in the semiconductor optical amplifier 16 is, for example, adjusted as follows. That is, when the input level of the signal light is low, the difference in optical path between the X and Y polarized waves from the polarizer 12 to a polarizer 17 is adjusted to be a multiple of the wavelength $\lambda 2$ (including 0). That is, when the input level of the signal light is low, the adjustment is made so that the phases of the X and Y polarized waves can match each other in the polarizer 17. The adjustment is made by, for example, controlling the electric current supplied to the semiconductor optical amplifier 16.

Figure 9:
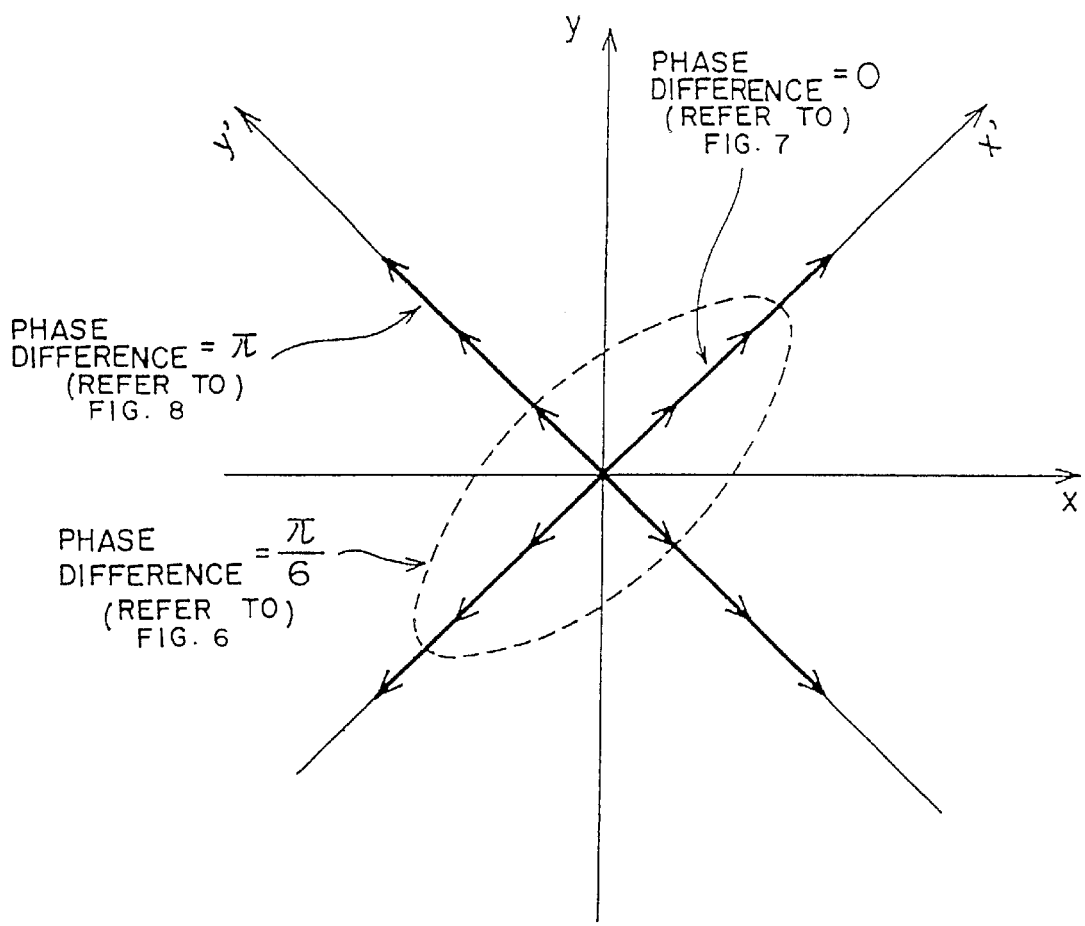
FIG. 9 shows the output from a coupling device.

The polarizer 17 couples the X and Y polarized waves. The state of the waves coupled by the polarizer 17 depends on the phase difference between the X and Y polarized waves as shown in FIGS. 6A through 8A and 6B through 8B. If the amount of delay in the semiconductor optical amplifier 16 is adjusted as described above, the light is output from the polarizer 17 as follows. That is, when the input level of the signal light having the wavelength $\lambda 1$ is low, the phases of the X and Y polarized waves match each other as shown in FIG. 7A, and the output light from the polarizer 17 becomes a polarized wave (in the same state as the input light having the wavelength $\lambda 2$) having the plane of polarization rotated by 45 degrees about the X axis as shown in FIG. 7B. In this case, the element in the Y' axis direction shown in FIG. 9 is 0. When the level of the signal light having the wavelength $\lambda 1$ is high, the X and Y polarized waves are shifted to each other, and the element in the Y' axis direction, as shown in FIG. 9, of the output light from the polarizer 17 is not 0.

A polarizer 18 outputs a polarized wave oscillating in the direction (X' axis shown in FIG. 9) rotated by 45 degrees about the X axis, and a polarized wave (whose electric field oscillates in the Y' axis direction shown in FIG. 9) normal to the above described polarized wave. Therefore, the intensity of the polarized wave, of the two polarized waves which are output from the polarizer 18, oscillating in the X' axis direction is the lowest when the level of the input of the signal light having the wavelength $\lambda 1$ is high. The intensity is higher when the level of the input of the signal light having the wavelength $\lambda 1$ is low than in the case where the level of the signal light having the wavelength $\lambda 1$ is high. The light oscillating in the X' axis direction is transmitted through the optical fiber 22. Thus, the above described wavelength converter receives a intensity-modulated signal light having the wavelength $\lambda 1$, and outputs the light which has the wavelength $\lambda 2$ and is inversely modulated based on the modulation state of the received signal light.

The polarizers 12, 17, and 18 can be realized using, for example, a birefringence material and/or a multilayer film polarization separation film. They can be provided with an optical filter between the semiconductor optical amplifier 16 and the polarizer 17 for passing only the wavelength $\lambda 2$ although it is not shown in the attached drawings. The half mirror 15 can be replaced with an optical coupler. Furthermore, lenses can be provided at the input/output unit of the wavelength converter and the input and output sides of the semiconductor optical amplifier 16 although it is not described above.

Figure 12:
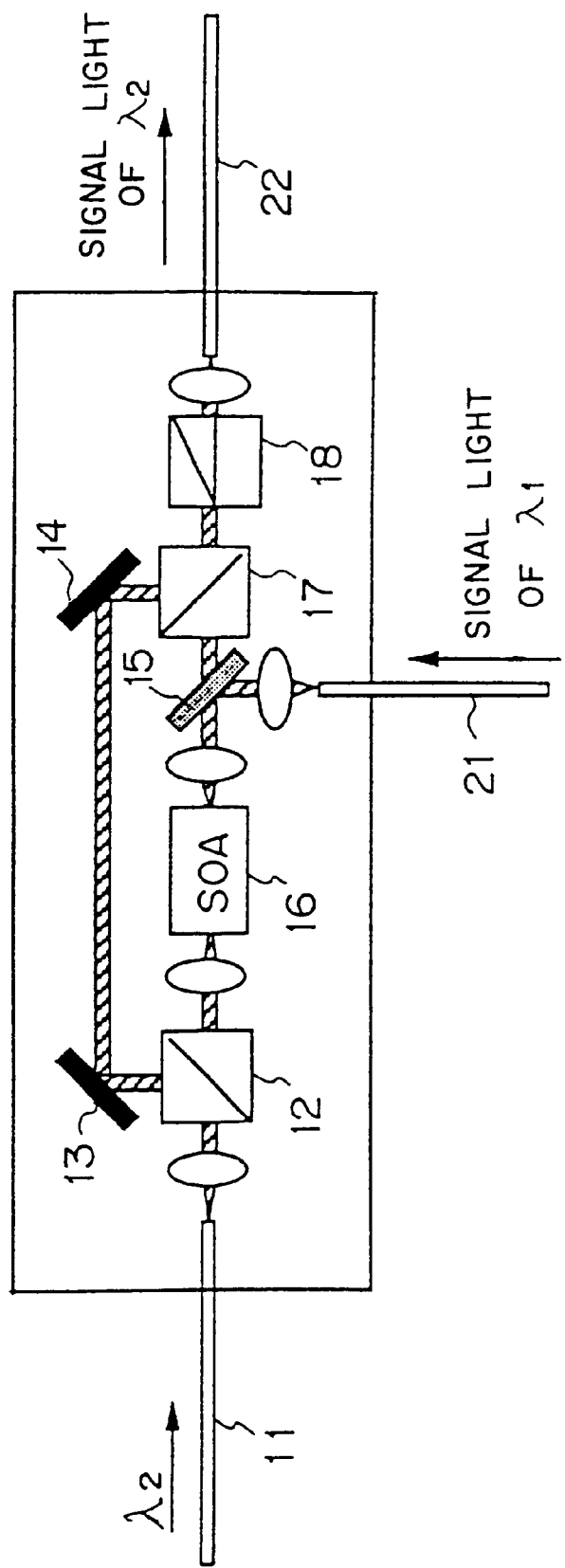

FIG. 12 shows the configuration according to the second embodiment of the present invention. The second embodiment is different from the first embodiment in incident direction to the semiconductor optical amplifier 16 of the signal light having the wavelength $\lambda 1$. That is, according to the first embodiment of the present invention, the signal light having the wavelength $\lambda 1$ and the input light having the wavelength $\lambda 2$ are input to the semiconductor optical amplifier 16 in the same direction. However, according to the second embodiment of the present invention, the signal light having the wavelength $\lambda 1$ and the input light having the wavelength $\lambda 2$ are input to the semiconductor optical amplifier 16 in the directions opposite to each other. With the configuration according to the second embodiment of the present invention, it is not necessary to provide an optical filter, between the semiconductor optical amplifier 16 and the polarizer 17, for passing only the wavelength $\lambda 2$.

Figure 13:
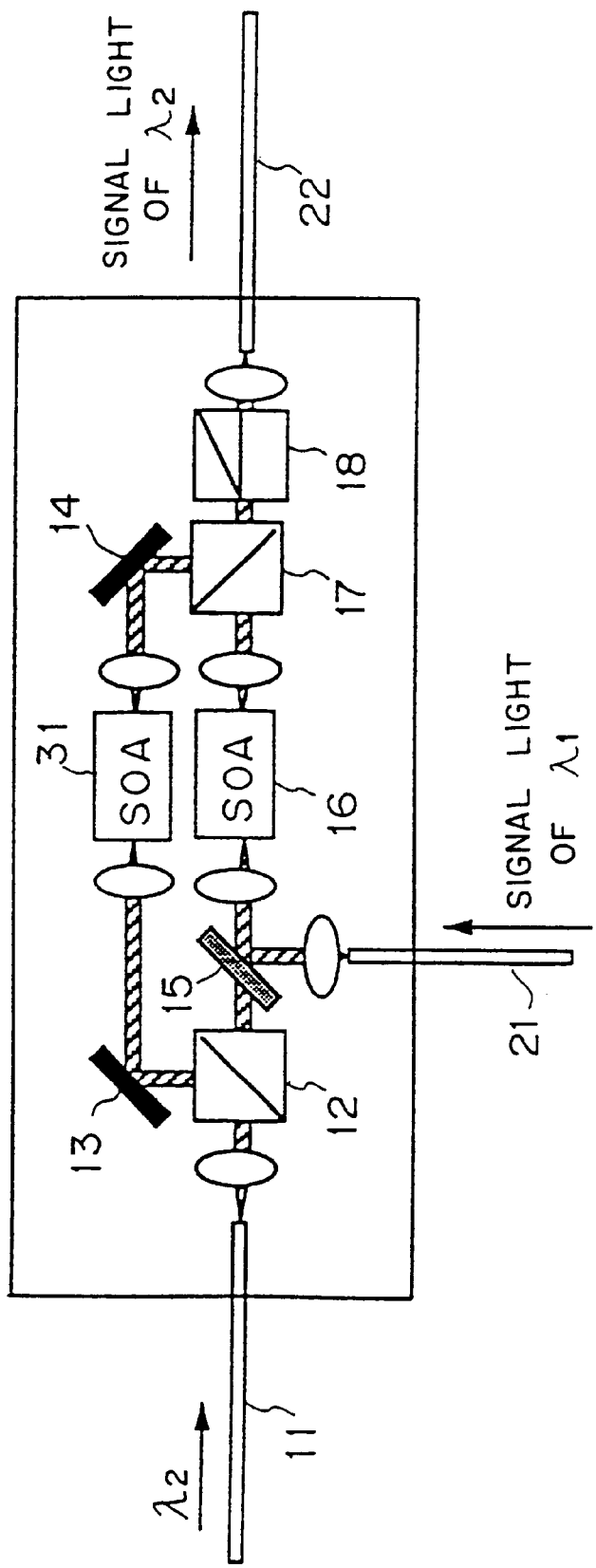

FIG. 13 shows the configuration according to the third embodiment of the present invention. The third embodiment is different from the first embodiment in that it has a semiconductor optical amplifier 31, between the polarizer 12 and the polarizer 17, for amplifying the Y polarized wave. With the configuration, the dynamic range of the light having the wavelength $\lambda 1$ becomes large.

Figure 14:
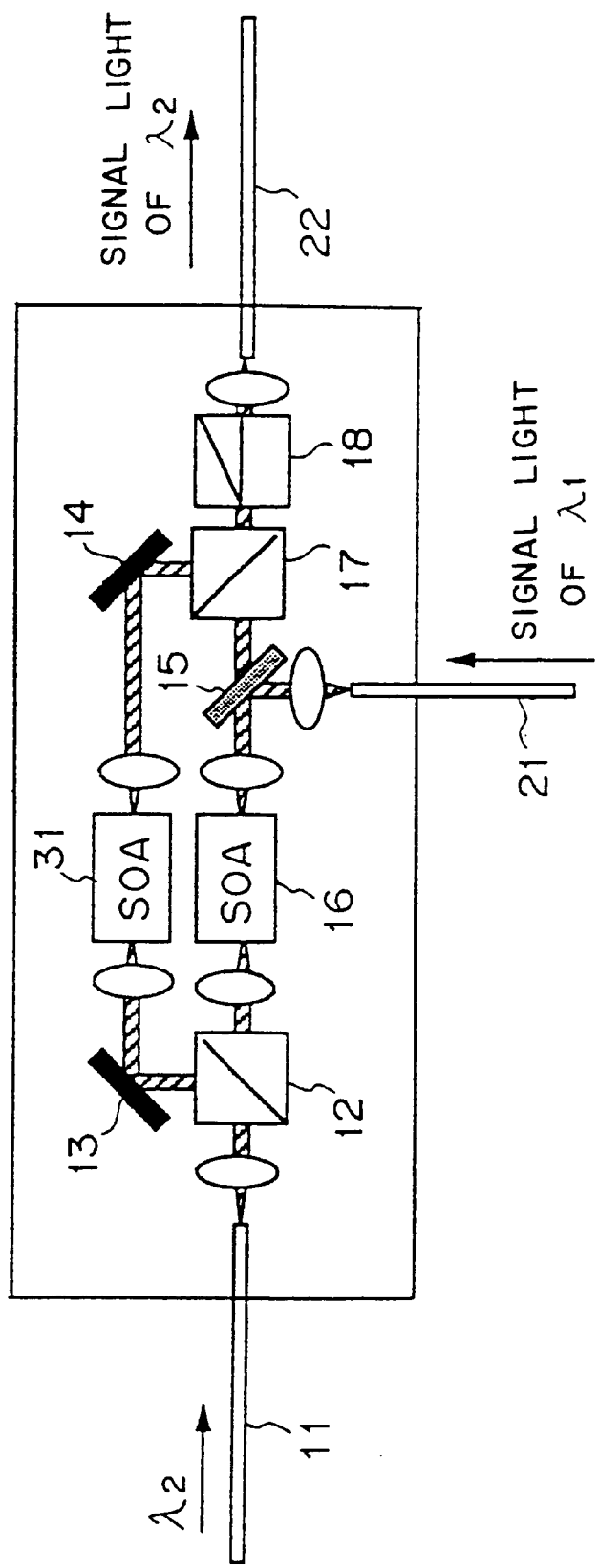

FIG. 14 shows the configuration according to the fourth embodiment of the present invention. The fourth embodiment is obtained by combining the configuration according to the second embodiment with the configuration according to the third embodiment of the present invention.

Figure 15:
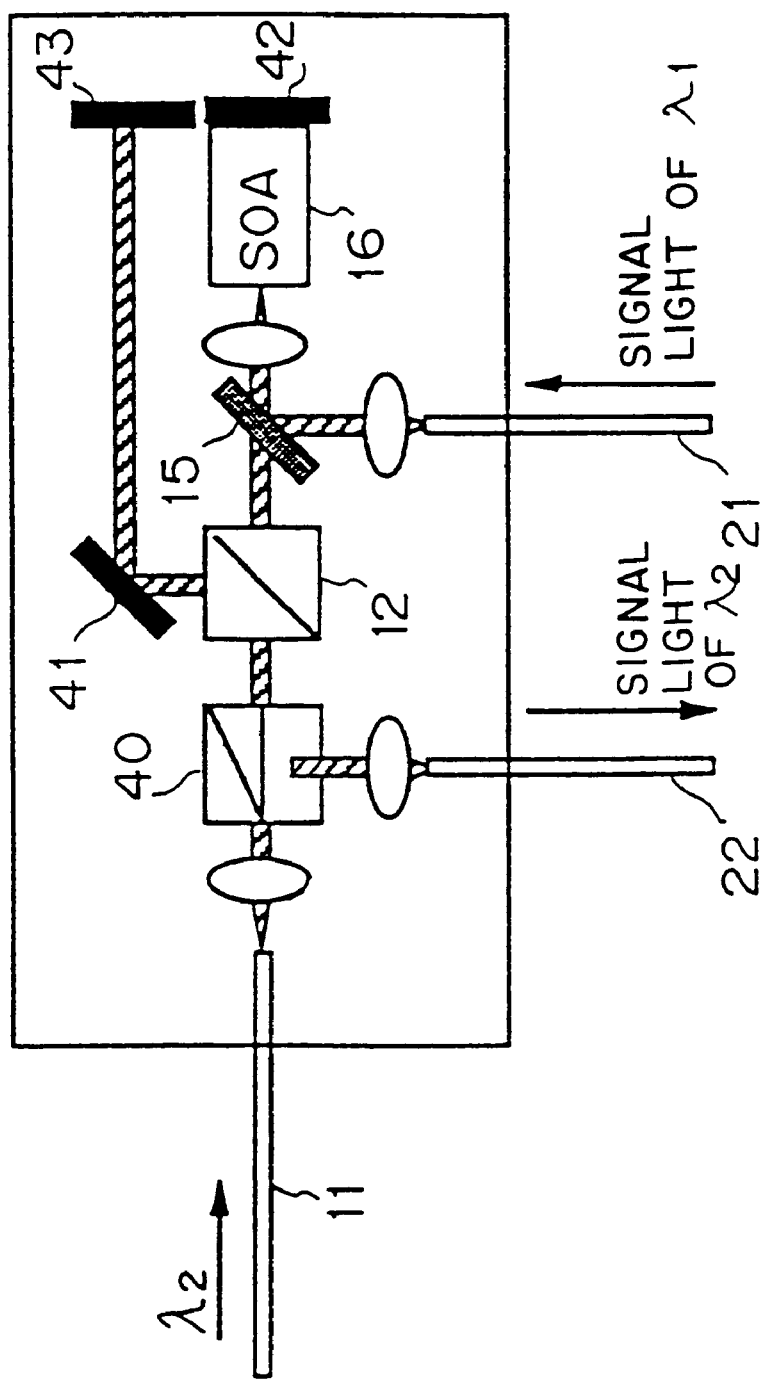

FIG. 15 shows the configuration according to the fifth embodiment of the present invention. According to the fifth embodiment, a light having a converted-to wavelength (light having the wavelength $\lambda 2$) is reflected in the wavelength converter to realize a small wavelength converter. Described below are the operations of the wavelength converter.

The incident light having the wavelength $\lambda 2$, which is a linearly polarized wave, passes through a polarizer 40 and is separated into two polarized waves normal to each other by the polarizer 12. The polarizer 40 is angled to pass the incident light having the wavelength $\lambda 2$ which is a linearly polarized wave. The X polarized wave generated by the polarizer 12 passes through the semiconductor optical amplifier 16, is reflected by the reflecting device 42, and is then returned to the polarizer 12. On the other hand, the Y polarized wave generated by the polarizer 12 is returned to the polarizer 12 by the reflecting devices 41 and 43.

The signal light having the wavelength $\lambda 1$ is led by the half mirror 15 to the semiconductor optical amplifier 16. The amount of delay in the semiconductor optical amplifier 16 changes depending on the intensity of this signal light having wavelength $\lambda 1$. Therefore, the phase of the X polarized wave changes depending on the intensity of the signal light having the wavelength $\lambda 1$.

The polarizer 12 couples the X and Y polarized waves returned after being reflected by reflecting devices 42 and 43. The phase of the X polarized wave depends on the intensity of the signal light having the wavelength $\lambda 1$. Therefore, the state of the polarization of the light having the wavelength $\lambda 2$ coupled by the polarizer 12 also depends on the intensity of the signal light having the wavelength $\lambda 1$. The light having the wavelength $\lambda 2$ coupled by the polarizer 12 is led to the polarizer 40.

The polarizer 40 generates polarized waves normal to each other from the lights coupled by the polarizer 12, and one of the generated polarized waves is led to the optical fiber 22. Since the state of the polarization of the light having the wavelength $\lambda 2$ coupled by the polarizer 12 depends on the intensity of the signal light having the wavelength $\lambda 1$, the intensity of the light output from the polarizer 40 to an optical fiber 22 is modulated depending on the modulation state of the signal light having the wavelength $\lambda 1$. Thus, the fifth embodiment depends on reflecting devices. With such a configuration, the operation of converting a wavelength is the same as the method described above by referring to FIGS. 4 through 10.

Figure 16:
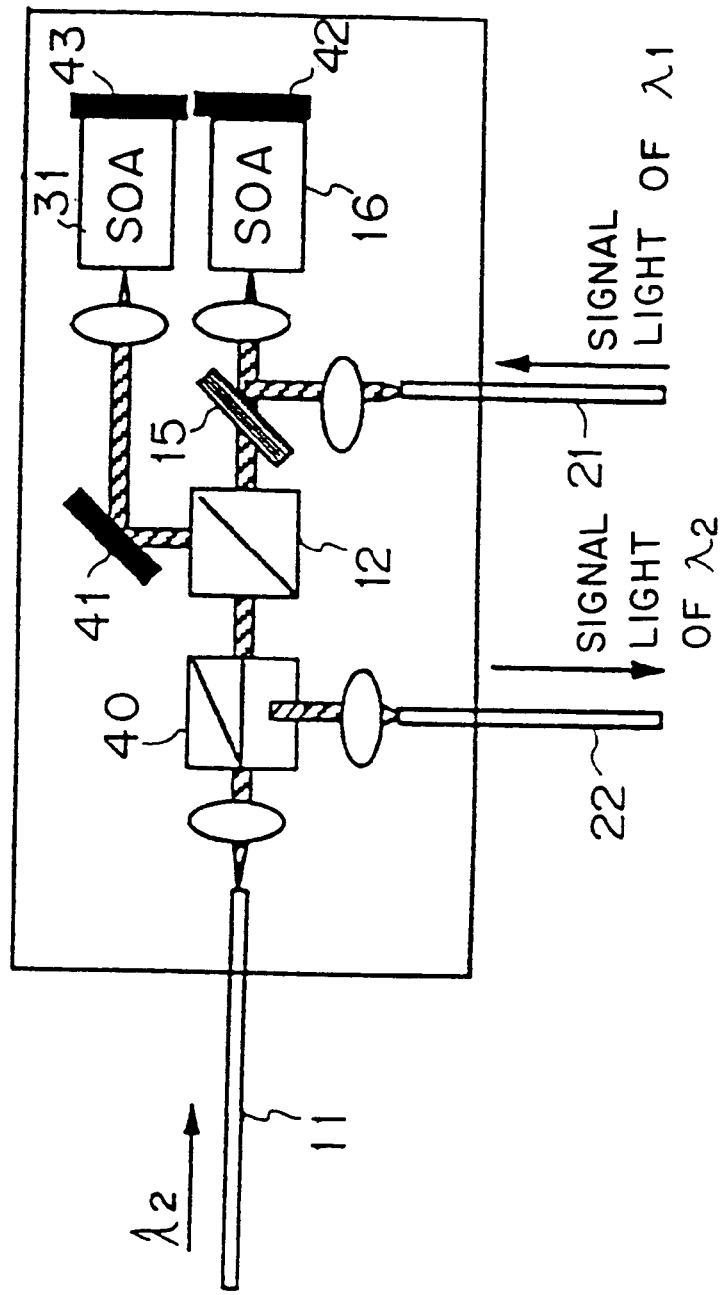

FIG. 16 shows the configuration according to the sixth embodiment of the present invention. The sixth embodiment is different from the fifth embodiment in that it has the semiconductor optical amplifier 31, between the reflecting devices 41 and 43, for amplifying the Y polarized wave. With the configuration, the dynamic range of the light having the wavelength $\lambda 1$ becomes large as in the third embodiment of the present invention.

Figure 17:
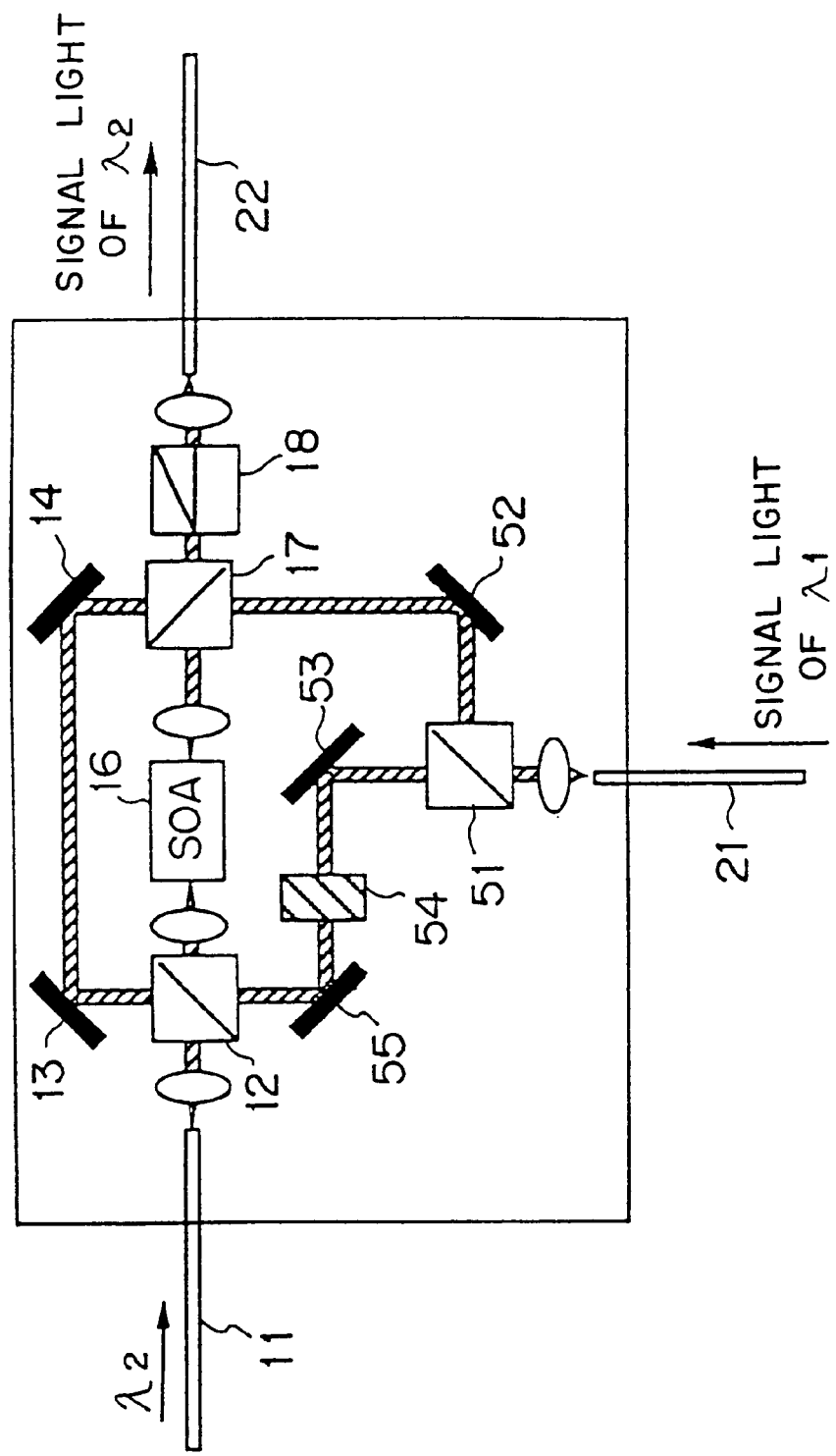

FIG. 17 shows the configuration according to the seventh embodiment of the present invention. According to the seventh embodiment, a half mirror or an optical coupler is not provided in the optical path of the wavelength $\lambda 2$ to reduce the optical loss of the wavelength $\lambda 2$.

The optical path of an incident light having the wavelength $\lambda 2$ is basically the same as that according to the first embodiment. That is, the incident light having the wavelength $\lambda 2$ is separated by the polarizer 12 into the X and Y polarized waves normal to each other. The X polarized wave passes through the semiconductor optical amplifier 16, and is led to the polarizer 17. Then, the Y polarized wave is led to the polarizer 17 by the reflecting devices 13 and 14. However, according to the seventh embodiment of the present invention, the X polarized wave is led to the polarizer 17 without passing through a half mirror.

The signal light having the wavelength $\lambda 1$ is separated by a polarizer 51 into polarized waves normal to each other. One polarized wave is led to the polarizer 17 by a reflecting device 52, and the other polarized wave is led by reflecting devices 53 and 55 to the polarizer 12. The polarized wave led to the polarizer 17 is assumed to have a plane of polarization such that the polarizer 17 can lead the polarized wave to the semiconductor optical amplifier 16. An optical rotator 54 is provided between the reflecting devices 53 and 55 so that the polarized wave led to the polarizer 12 can be led by the polarizer 12 to the semiconductor optical amplifier 16. The optical rotator 54 rotates the plane of polarization of passing lights by 90 degrees.

Thus, according to the seventh embodiment, the signal light having the wavelength $\lambda 1$ is led to the semiconductor optical amplifier 16 without a half mirror, etc. unlike the first through sixth embodiments. Therefore, the light having the wavelength $\lambda 2$ is led to the polarizer 17 without passing through the half mirror, etc., thereby reducing the optical loss of the light having wavelength $\lambda 2$.

Figure 18:
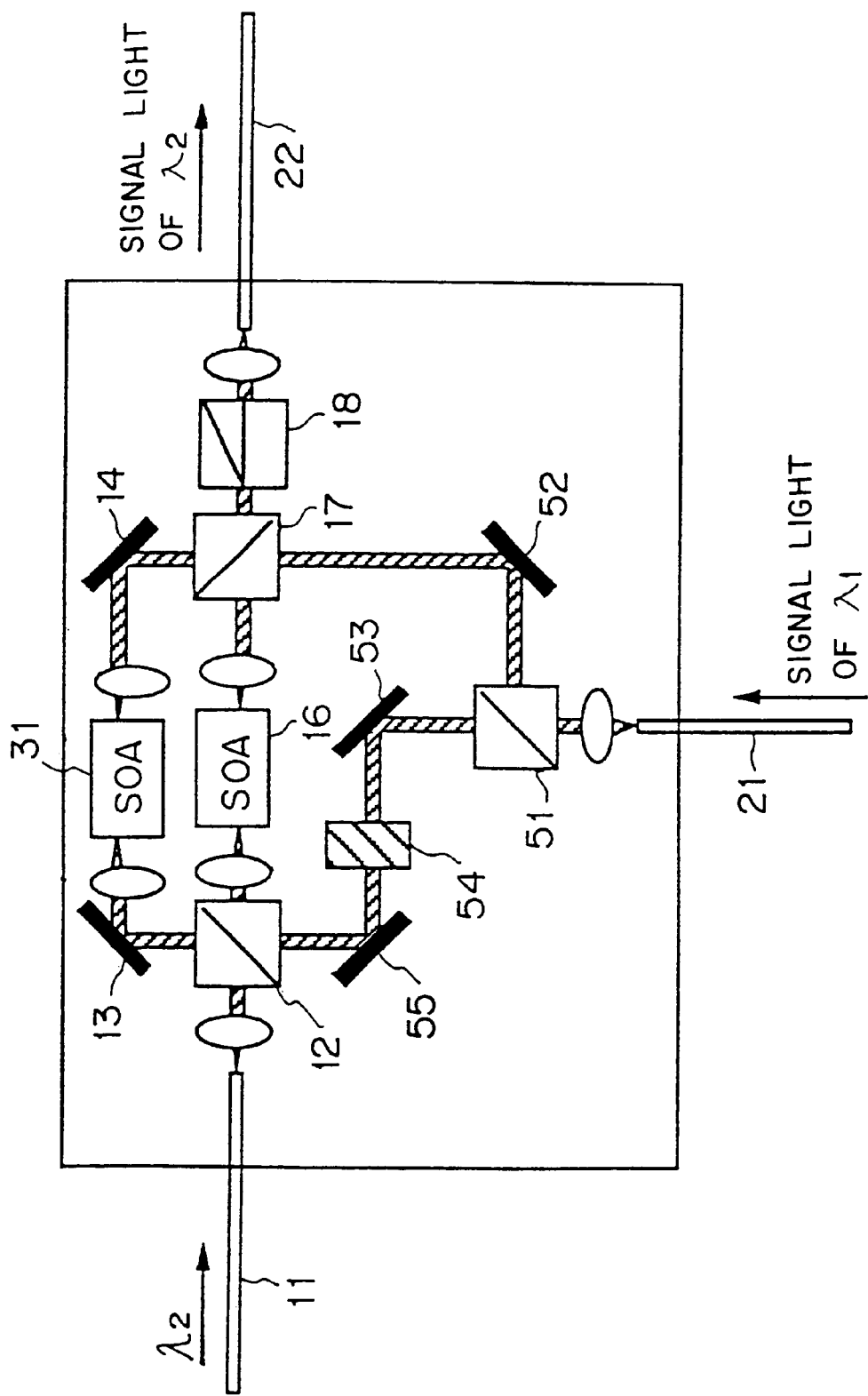

FIG. 18 shows the configuration according to the eighth embodiment of the present invention. The eighth embodiment is different from the seventh embodiment in that the semiconductor optical amplifier 31 is provided, between the reflecting devices 13 and 14, for amplifying the Y polarized wave.

FIG. 19 shows the configuration according to the ninth embodiment of the present invention. The ninth embodiment is based on the configuration according to the sixth embodiment shown in FIG. 16, and changes the method of inputting the signal light having the wavelength $\lambda 1$. According to the ninth embodiment of the present invention, half mirrors 61 and 62 are used instead of the reflecting devices 42 and 43. The signal light having the wavelength $\lambda 1$ passes through the half mirror 61 and is input to the semiconductor optical amplifier 16.

Figure 20:
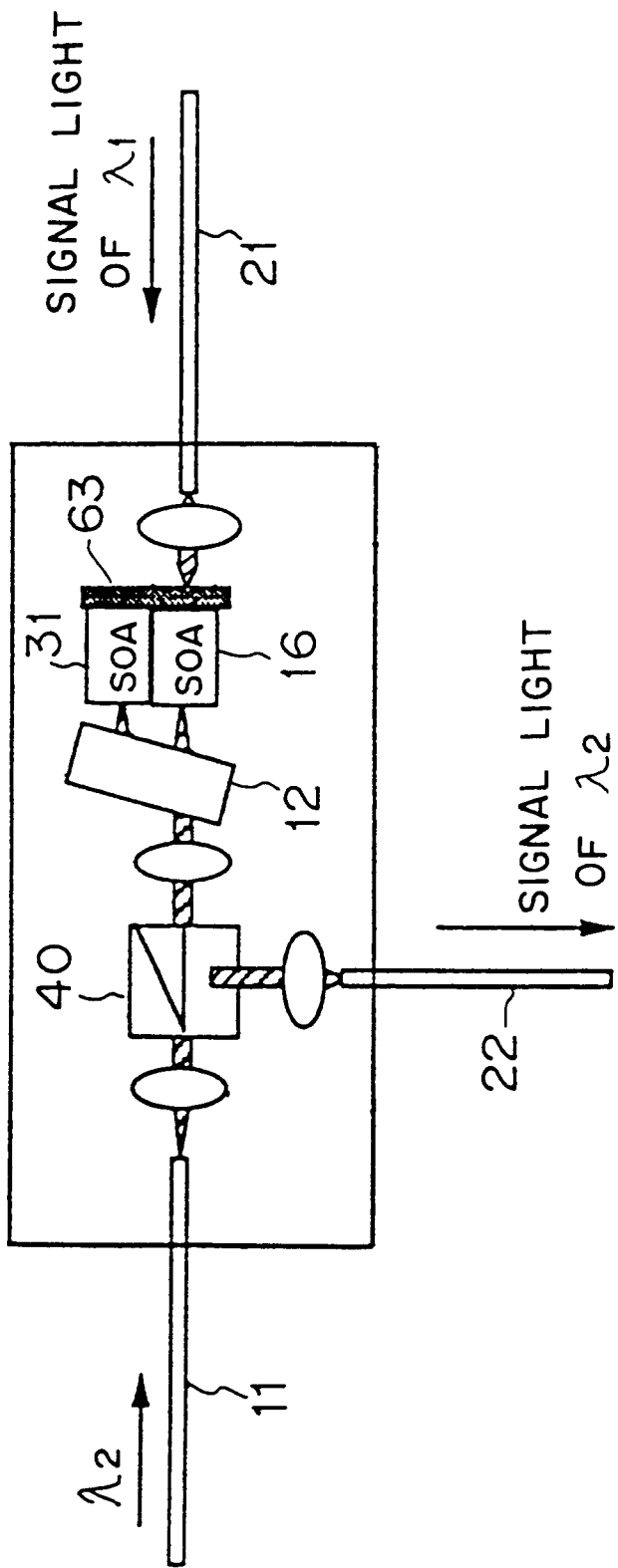

FIG. 20 shows the configuration according to the tenth embodiment of the present invention. The tenth embodiment is a variation of the ninth embodiment shown in FIG. 19. According to the tenth embodiment of the present invention, the X and Y polarized waves generated by the polarizer 12 are directly input to the semiconductor optical amplifiers 16 and 31. The half mirrors 61 and 62 used in the ninth embodiment are replaced with one half-mirror (half mirror 63). The polarizer 12 such as a birefringence material, etc. is designed to be approximately angled so that the above described configuration can be realized.

Figure 21:
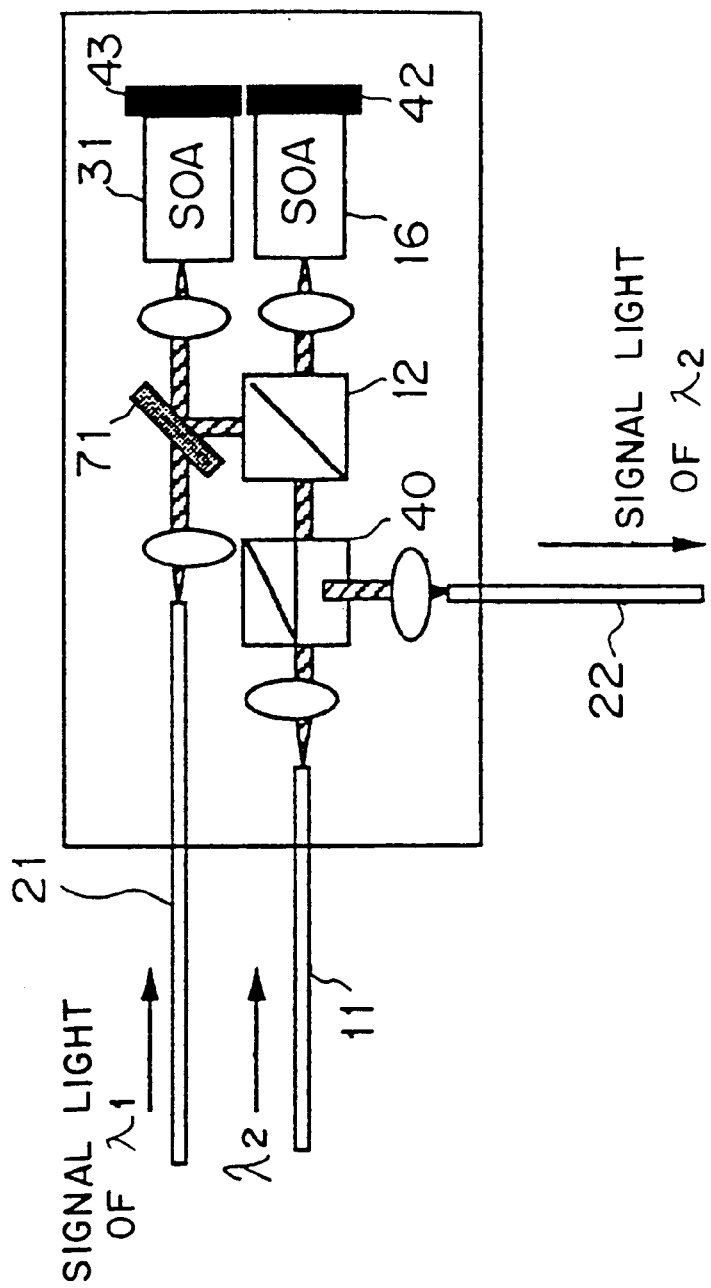

FIG. 21 shows the configuration according to the eleventh embodiment of the present invention. The eleventh embodiment is a variation of the sixth embodiment shown in FIG. 16. According to the eleventh embodiment, the reflection factor of a reflecting device for leading one polarized wave separated from the incident light having the wavelength $\lambda 2$ to a semiconductor optical amplifier should be smaller than 1. Using the reflecting device, the signal light having the wavelength $\lambda 1$ is led to the semiconductor optical amplifier. That is, the incident light having the wavelength $\lambda 2$ is separated by the polarizer 12 into the polarized waves normal to each other. One of the polarized waves is led as is to the semiconductor optical amplifier 16. The other is led by a half mirror 71 to the semiconductor optical amplifier 31. The signal light having the wavelength λ1 passes through the half mirror 71, and a part of it is led to the semiconductor optical amplifier 31.

With the above described configuration, the phase of the polarized wave, of the two polarized waves generated by the polarizer 12, led to the semiconductor optical amplifier 31 is adjusted depending on the intensity of the signal light having the wavelength λ1. After these two polarized waves have been coupled, predetermined elements of the plane of polarization are separated and output by the polarizer 40. This method is the same as that according to other embodiments of the present invention.

Figure 22:
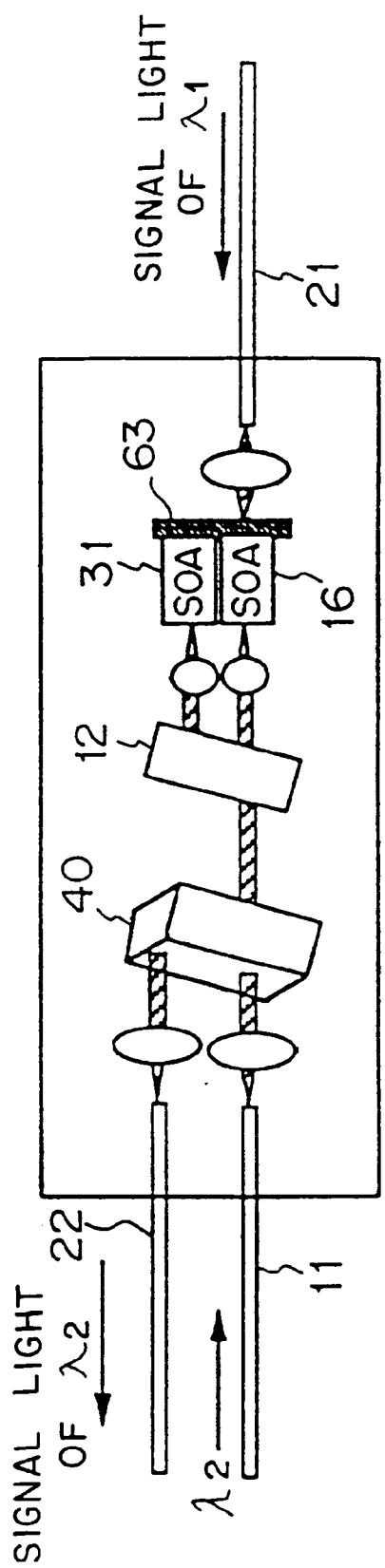

FIG. 22 shows the configuration according to the twelfth embodiment of the present invention. The twelfth embodiment is basically the same as the tenth embodiment shown in FIG. 20. The tenth and twelfth embodiments of the present invention are different from each other in lens position, etc.

Figure 23:
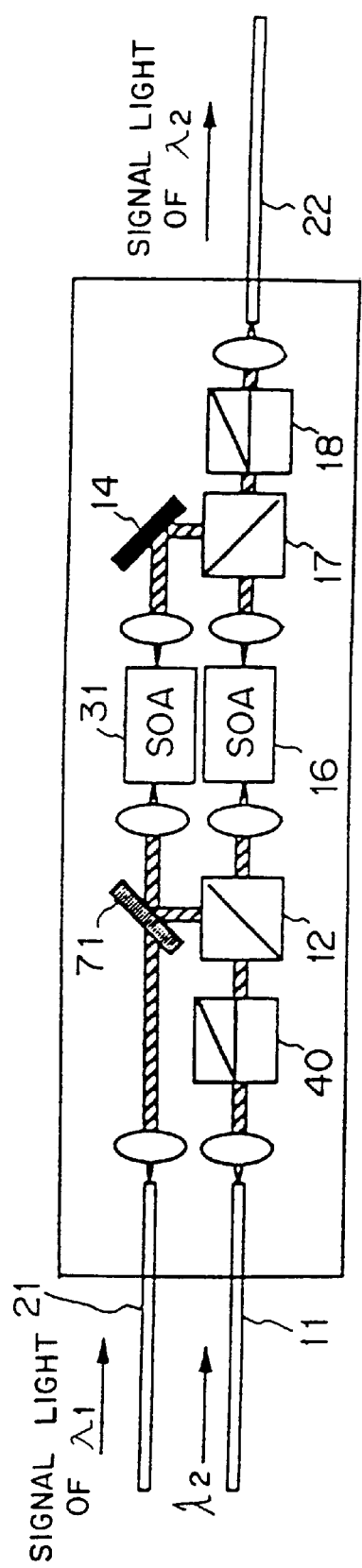
Figure 24:
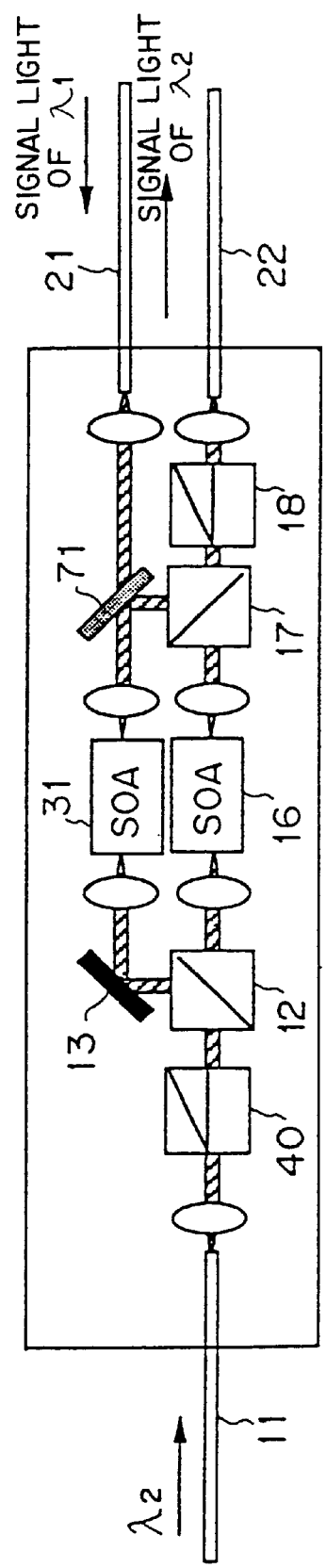

FIGS. 23 and 24 respectively show the configurations of the thirteenth and fourteenth embodiments of the present invention. The thirteenth and fourteenth embodiments are based on the first embodiment of the present invention as shown in FIG. 11. The method of inputting the signal light having the wavelength λ1 is the method according to the eleventh embodiment shown in FIG. 21. That is, the signal light having the wavelength λ1 is led by the half mirror 71 to the semiconductor optical amplifier 31. The thirteenth and the fourteenth embodiments are different from each other in direction in which the signal light having the wavelength λ1 is input.

Figure 26:
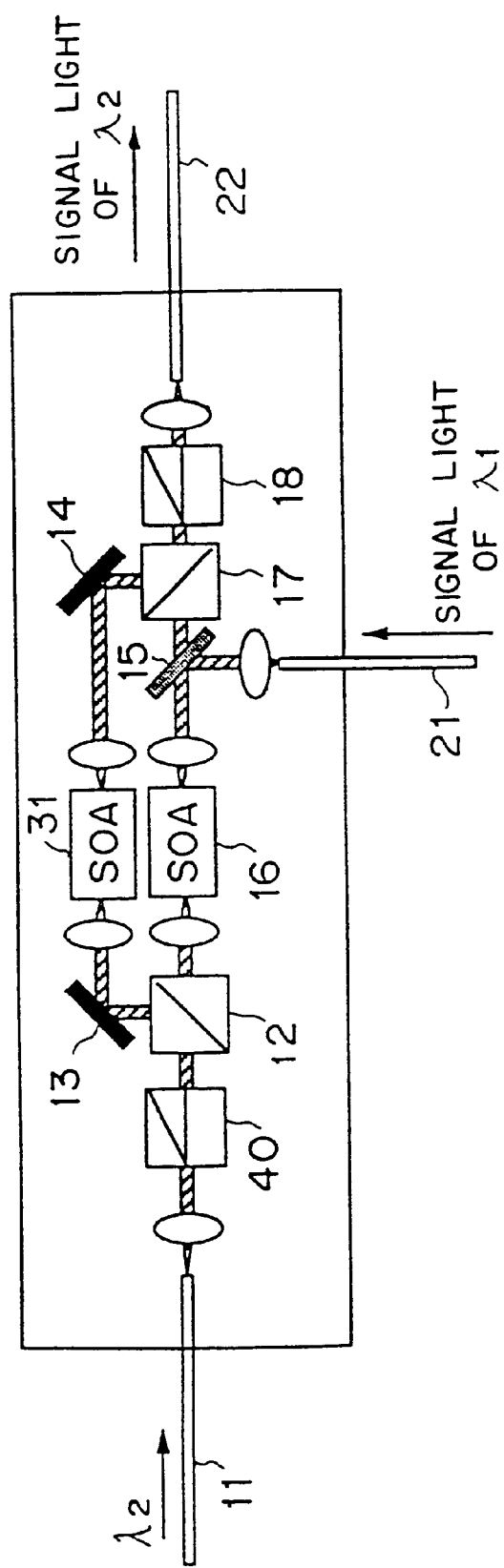

FIGS. 25 and 26 show the configurations according to the fifteenth and sixteenth embodiments of the present invention. The fifteenth and sixteenth embodiments are based on the third and fourth embodiments of the present invention, and have the polarizer 40 before the polarizer 12. The polarizer 40 makes the incident light having the wavelength λ2 close to a linearly polarized wave. Then, the extinction ratio (ratio of the value when the intensity of the light is high to the value when the intensity of the light is low) obtained when the light having the wavelength λ2 is intensity-modulated can be improved. It is also possible to input a light having the wavelength λ2 stably-polarized in time as an incident light other than linearly polarized waves to generate a linearly polarized wave from the incident light using the polarizer 40.

Figure 27:
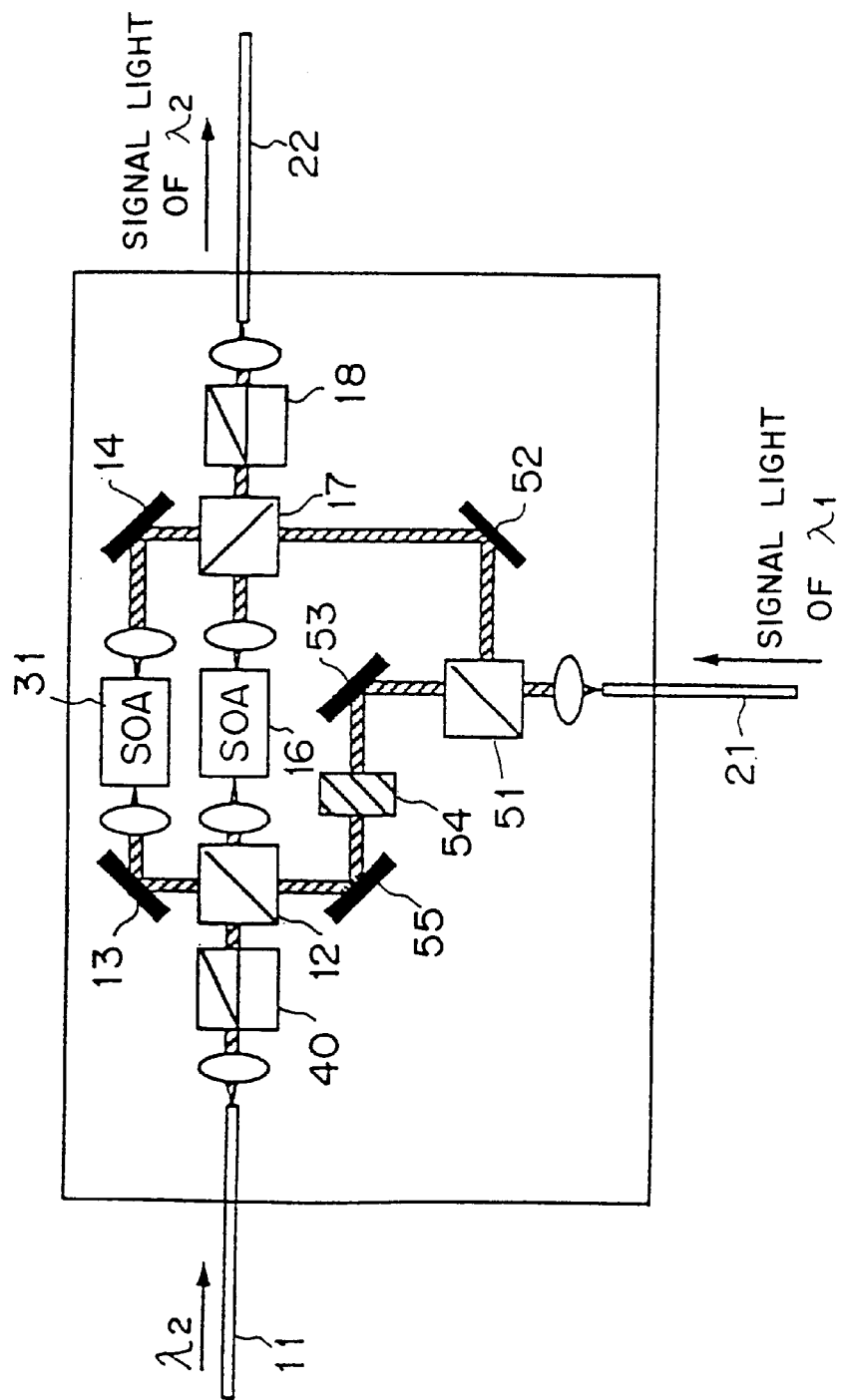

FIG. 27 shows the configuration according to the seventeenth embodiment of the present invention. The seventeenth embodiment is based on the eighth embodiment shown in FIG. 18, and has the polarizer 40 before the polarizer 12. The effect of providing the polarizer 40 is the same as the effect obtained according to the fifteenth or sixteenth embodiment of the present invention.

Figure 28:
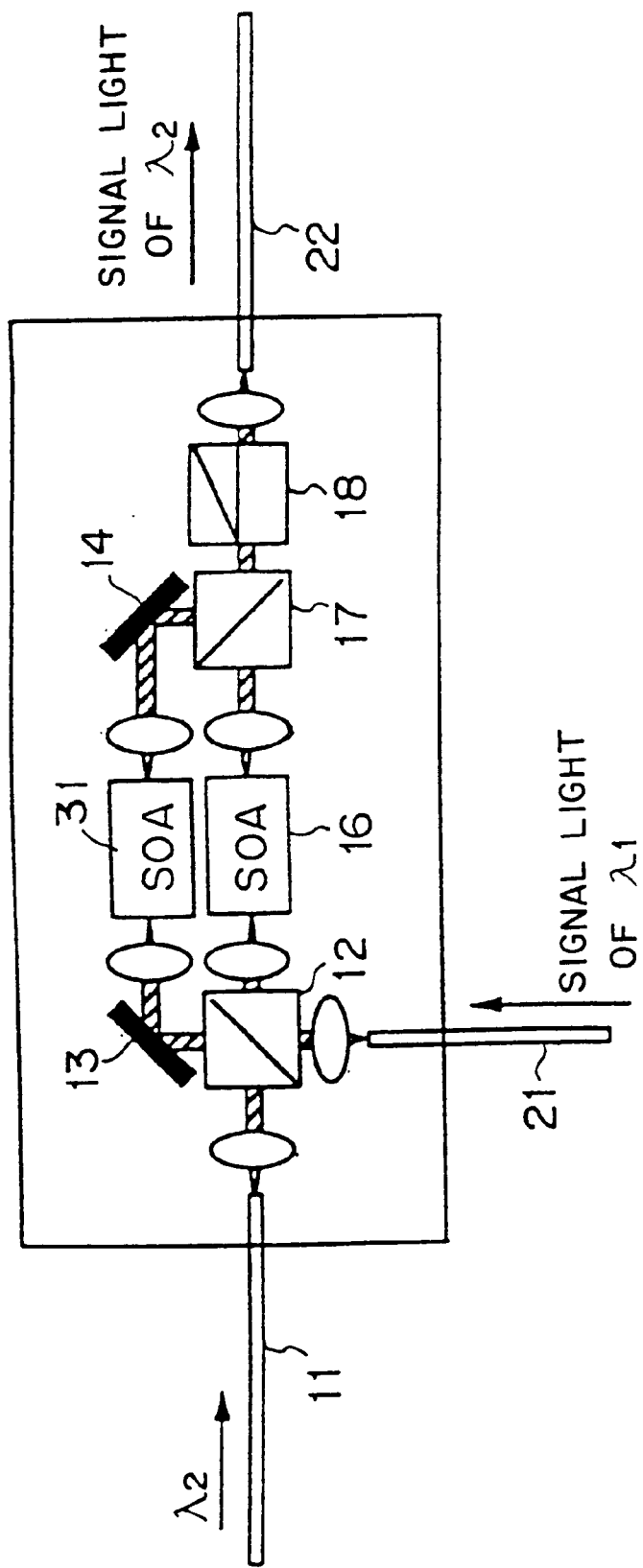
Figure 29:
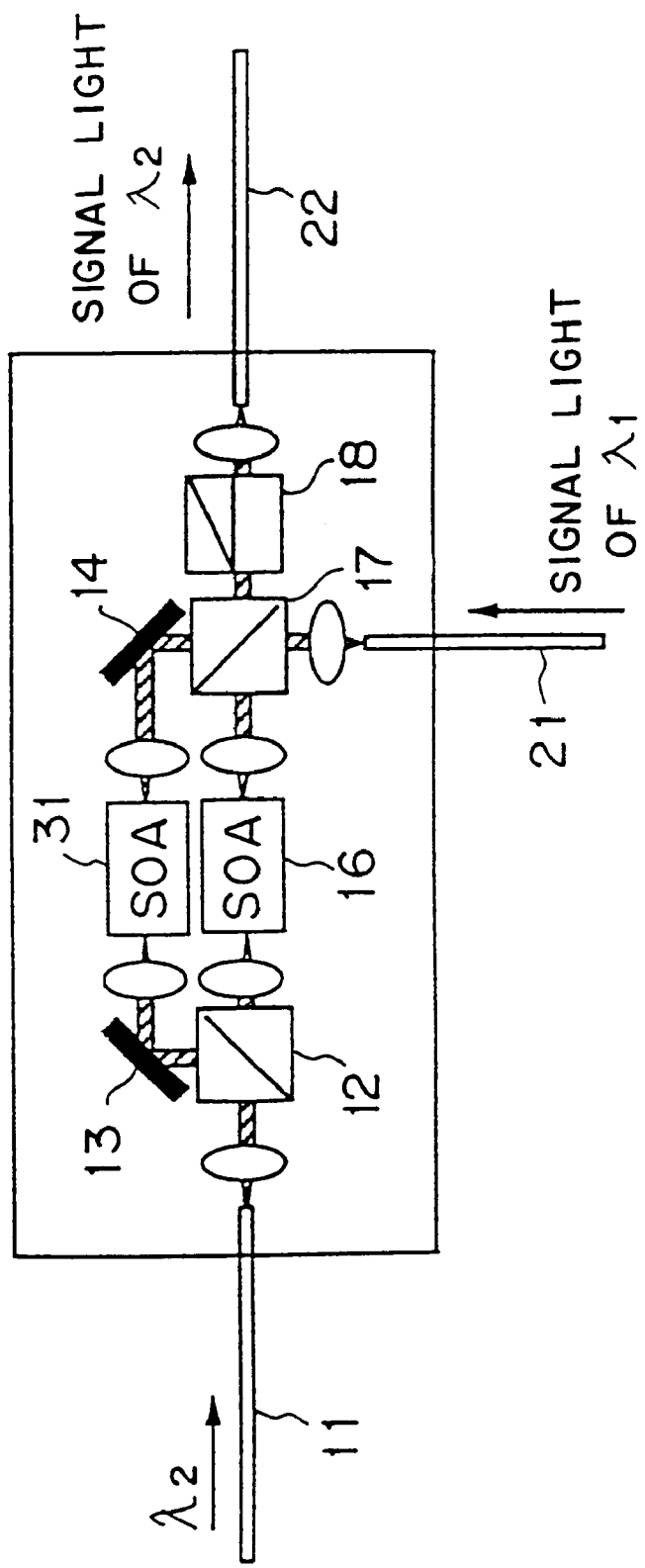

FIGS. 28 and 29 show the configurations according to the eighteenth and nineteenth embodiments of the present invention. The eighteenth and nineteenth embodiments are based on the third embodiment shown in FIG. 13. The eighteenth embodiment has the configuration in which the signal light having the wavelength λ1 is led to the semiconductor optical amplifier 16 using the polarizer 12 for separating the incident light having the wavelength λ2 into polarized waves normal to each other. The nineteenth embodiment has the configuration in which the signal light having the wavelength λ1 is led to the semiconductor optical amplifier 16 using the polarizer 17 for coupling the polarized waves which have the wavelength λ2 and are normal to each other.

In both of eighteenth and nineteenth embodiments, the polarization of the signal light having wavelength λ1 is almost linear polarized so as to be led to semiconductor optical amplifier 16 by the polarizer (polarizer 12 or polarizer 17).

Figure 30:
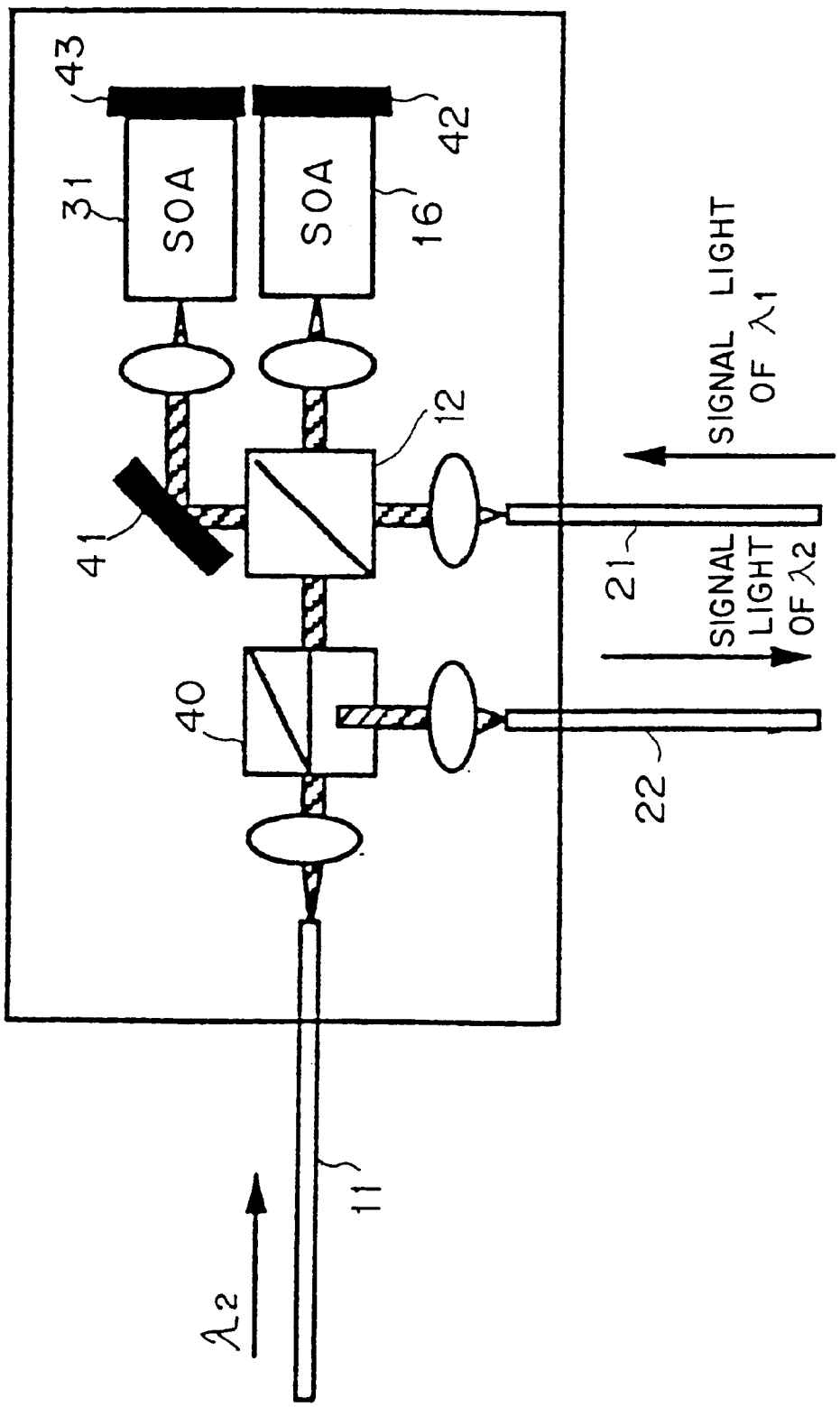

FIG. 30 shows the configuration according to the twentieth embodiment of the present invention. The twentieth embodiment is based on the eighth embodiment shown in FIG. 18, and uses the method according to the eighteenth embodiment as a method of leading the signal light having the wavelength λ1 to the semiconductor optical amplifier 16.

Figure 31:
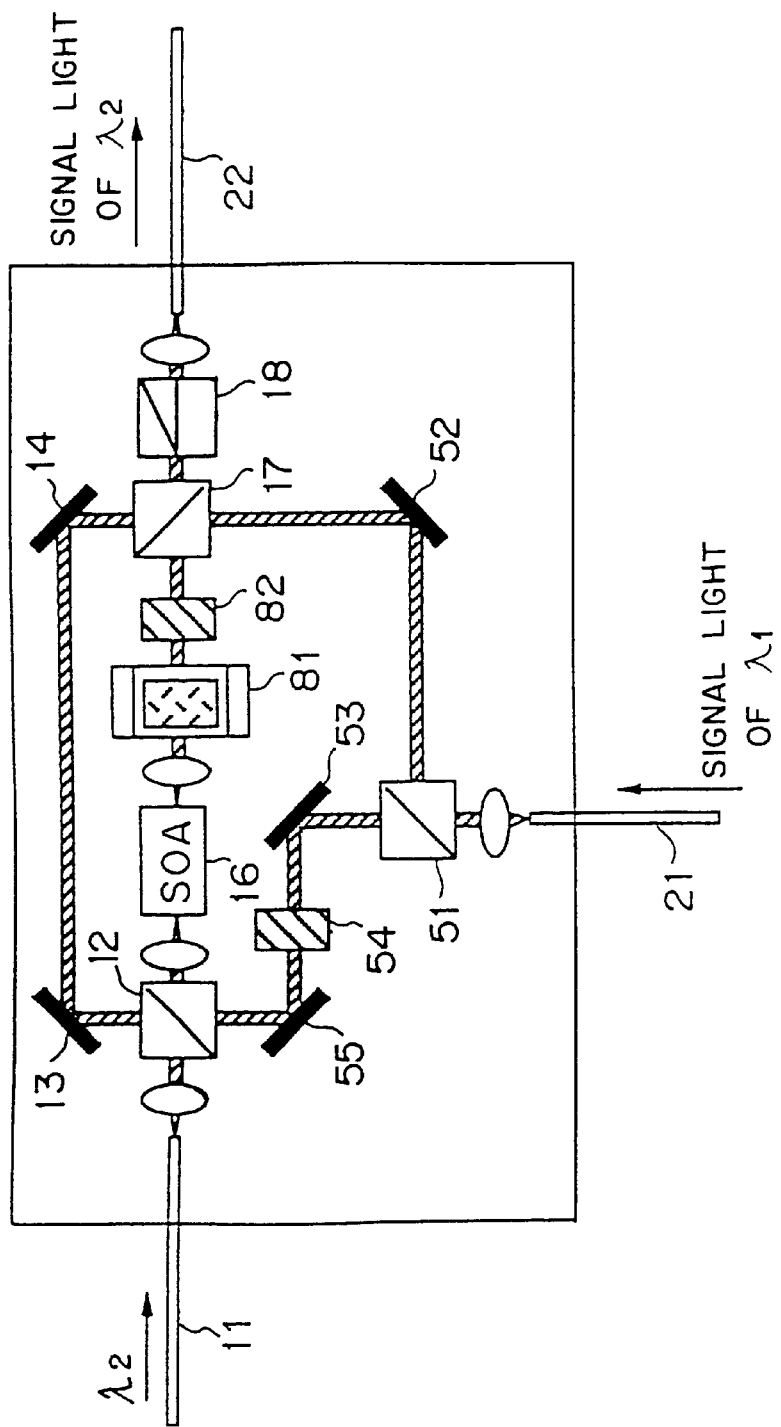
Figure 33:
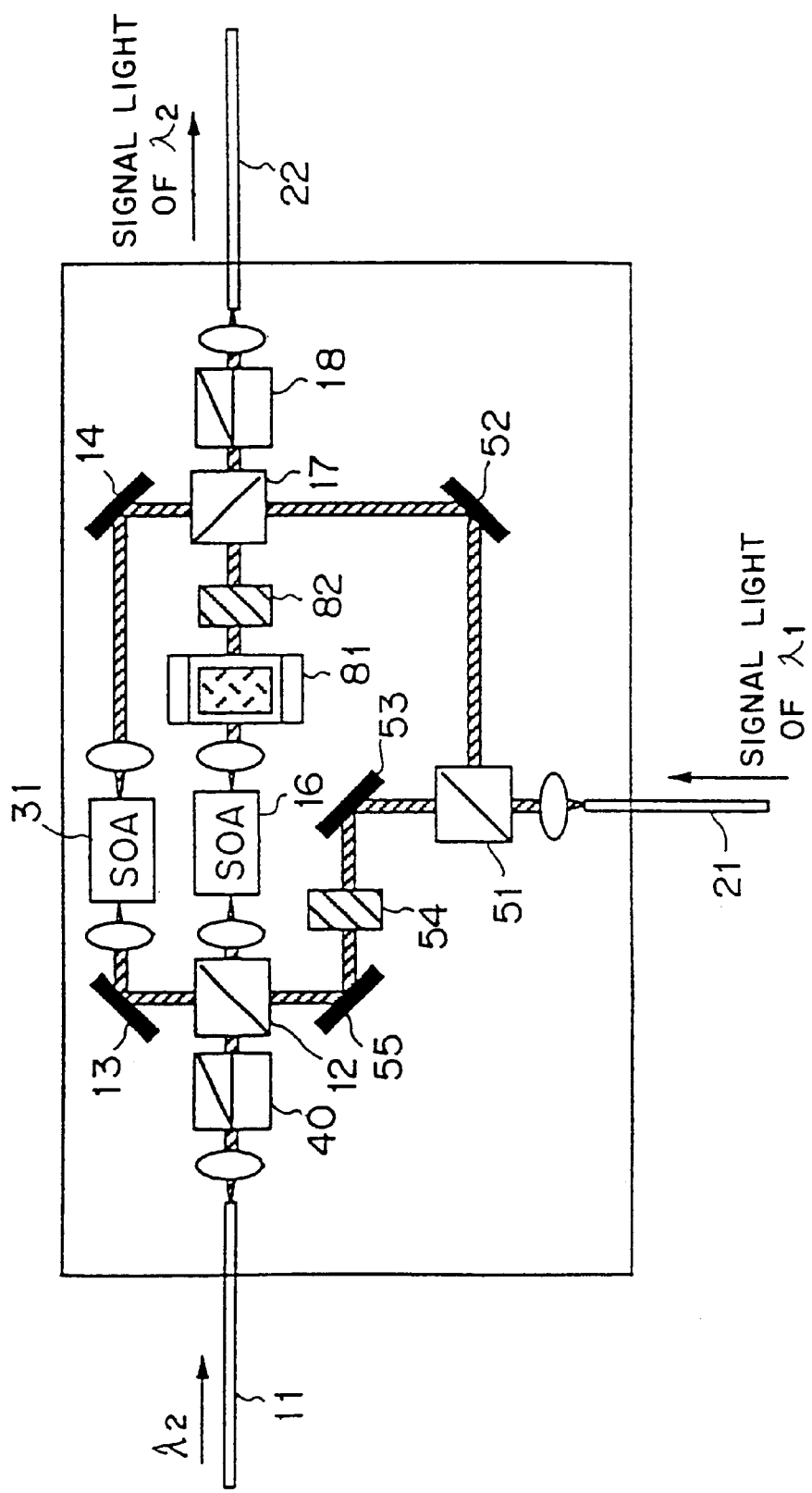

FIGS. 31 through 33 show the configurations according to the twenty-first through twenty-third embodiments. The twenty-first through twenty-third embodiments have the configuration in which a Faraday rotator 81 and an optical rotator 82 are provided between the semiconductor optical amplifier 16 and the polarizer 17 in the seventh embodiment shown in FIG. 17. The Faraday rotator 81 and the optical rotator 82 have a rotation angle of 45 degrees. When a light is transmitted from the semiconductor optical amplifier 16 to the polarizer 17, the Faraday rotator 81 and the optical rotator 82 are set such that the light can be rotated clockwise and counterclockwise by the Faraday rotator 81 and the optical rotator 82.

With the configuration, when a light is transmitted from the semiconductor optical amplifier 16 to the polarizer 17, the polarization of the light does not change using the Faraday rotator 81 and the optical rotator 82. Therefore, the X polarized wave obtained by separating the incident light having the wavelength λ2 into polarized waves normal to each other is input to the polarizer 17 as the polarized wave output from the semiconductor optical amplifier 16. On the other hand, when a light is transmitted from the polarizer 17 to the semiconductor optical amplifier 16, the light is rotated by 45 degrees while passing through the optical rotator 82, and is further rotated by 45 degrees in the same direction while passing through the Faraday rotator 81. That is, when the light is transmitted from the polarizer 17 to the semiconductor optical amplifier 16, the polarization is rotated by 90 degrees. Therefore, the signal light having the wavelength λ1 is rotated by 90 degrees by the optical rotator 82 and the Faraday rotator 81 when it is led from the polarizer 17 to the semiconductor optical amplifier 16.

According to the twenty-first through twenty-third embodiments of the present invention, the signal light having the wavelength λ1 is input from both ends of the semiconductor optical amplifier 16. However, the signal light input from the polarizer 17 to the semiconductor optical amplifier 16 is rotated by 90 degrees by the Faraday rotator 81 and the optical rotator 82. Therefore, the signal lights input from both ends of the semiconductor optical amplifier 16 are normal to each other, and the interference between the two signals can be considerably reduced in the semiconductor optical amplifier 16. When the interference in the semiconductor optical amplifier 16 is reduced, the operations of the wavelength converter become stable.

The twenty-second embodiment of the present invention has the configuration in which the semiconductor optical amplifier 31 for amplifying the Y polarized wave is added to the configuration according to the twenty-first embodiment. The twenty-third embodiment of the present invention has the configuration in which the polarizer 40 for improving the polarization of the incident light having the wavelength λ2 is added to the configuration according to the twenty-second embodiment.

FIG. 34 shows the configuration according to the twenty-fourth embodiment of the present invention. The twenty-fourth embodiment is based on the sixth embodiment shown in FIG. 16, and the method of inputting the signal light having the wavelength λ1 is realized by separating the signal light into two polarized waves normal to each other, and then leading them to the semiconductor optical amplifier 16.

The incident light having the wavelength λ2 is separated into the X and Y polarized waves normal to each other by the polarizer 12. The X polarized wave passes through a Faraday rotator 91, the semiconductor optical amplifier 16, a Faraday rotator 96, and the optical rotator 97, and is input to the polarizer 98. The output light from a polarizer 98 is reflected by a reflecting device 99 provided on the back of the polarizer 98, and is transmitted through the path from the polarizer 12 to the reflecting device 99 in the inverse direction, and is returned to the polarizer 12. On the other hand, the Y polarized wave is amplified by the semiconductor optical amplifier 31, and is led to the polarizer 12 through the reflecting device 43.

The signal light having the wavelength λ1 is separated by the polarizer 51 into two polarized waves normal to each other. One polarized wave is reflected by a reflecting device 90, passes through the polarizer 12 and the Faraday rotator 91, and then is input to the semiconductor optical amplifier 16. The other polarized wave passes through a Faraday rotator 93, the polarizer 98, the optical rotator 97, and the Faraday rotator 96, and is then input to the semiconductor optical amplifier 16.

The Faraday rotators 91, 93, and 96 rotate the plane of polarization of each passing light counterclockwise by 45 degrees. The optical rotator 97 rotates the plane of polarization of a light counterclockwise by 45 degrees when the light is transmitted through the optical rotator 97 from the Faraday rotator 96 to the polarizer 98. The optical rotator 97 rotates the plane of polarization of a light clockwise by 45 degrees when the light is transmitted through the optical rotator 97 from the polarizer 98 to the Faraday rotator 96. The Faraday rotator 93 can be replaced by an optical rotator for rotating a passing light by 45 degrees.

Figure 35:
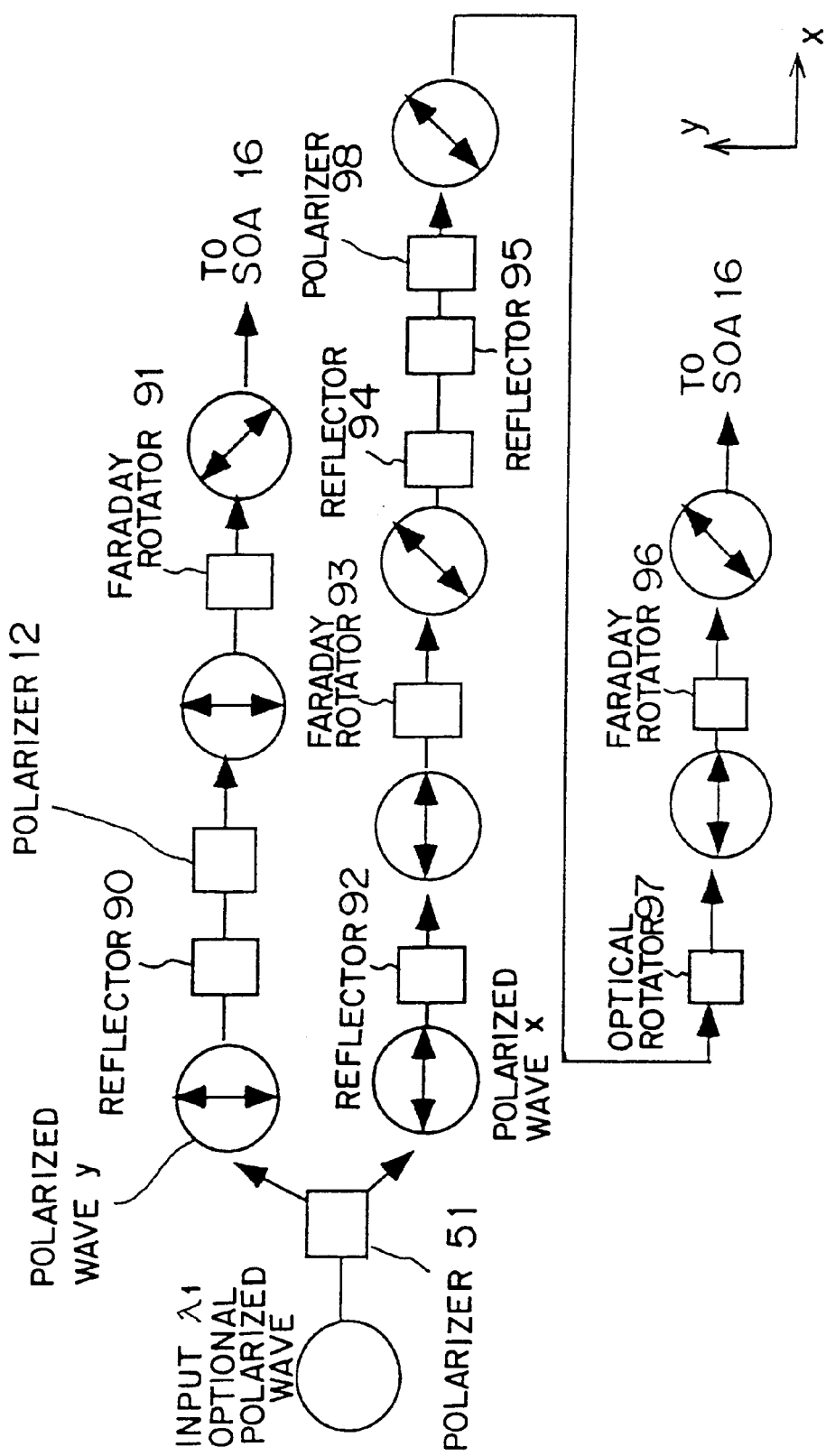
FIG. 35 shows the polarized state of the signal light having the wavelength $\lambda 1$ according to the twenty-fourth embodiment.

FIG. 35 shows the polarization of the signal light having the wavelength λ1 in the configuration according to the twenty-fourth embodiment of the present invention. The signal light having the wavelength λ1 is separated into two polarized waves normal to each other. These polarized waves are referred to as an X polarized wave and a Y polarized wave. The X polarized wave is input to the semiconductor optical amplifier 16 with the plane of polarization rotated by 45, −45, and 45 degrees respectively by the Faraday rotator 93, the optical rotator 97, and the Faraday rotator 96. In this example, the 'counterclockwise' refers to the positive rotation. On the other hand, the Y polarized wave is input to the semiconductor optical amplifier 16 with the plane of polarization rotated by 45 degrees by the Faraday rotator 91. Therefore, the signal light having the wavelength λ1 is separated into two polarized waves normal to each other, and is then input as waves normal to each other to the semiconductor optical amplifier 16.

FIG. 36 shows the polarization of an incident light having the wavelength λ2 in the configuration according to the above described twenty-fourth embodiment of the present invention. The incident light having the wavelength λ2 is separated by the polarizer 12 into the X and Y polarized waves. The X polarized wave reaches the reflecting device 99 with the plane of polarization rotated by 45 degrees individually by the Faraday rotator 91, the Faraday rotator 96, and the optical rotator 97. Then, the X polarized wave reflected by the reflecting device 99 is returned to the polarizer 12 with the plane of polarization rotated by the optical rotator 97, the Faraday rotator 96, and the Faraday rotator 91 respectively by −45, 45, and 45 degrees.

Therefore, the X polarized wave is reflected by the reflecting device 99, and is then input to the polarizer 12 in the polarization state in the x direction. On the other hand, the Y polarized wave is reflected by the reflecting device 43 without rotation of the plane of polarization, and is then returned to the polarizer 12. Therefore, the Y polarized wave is reflected by the reflecting device 43, and is then input to the polarizer 12 in the polarization state in the y direction.

FIGS. 37 through 41 show the configurations respectively according to the twenty-fifth through twenty-ninth embodiments of the present invention. The twenty-fifth through twenty-ninth embodiments are respectively based on the second embodiment shown in FIG. 12, the fourth embodiment shown in FIG. 14, the fourteenth embodiment shown in FIG. 24, the sixteenth embodiment shown in FIG. 26, and the nineteenth embodiment shown in FIG. 29. According to the embodiments, the optical path-length of the X polarized wave matches the optical path-length of the Y polarized wave.

Figure 37:
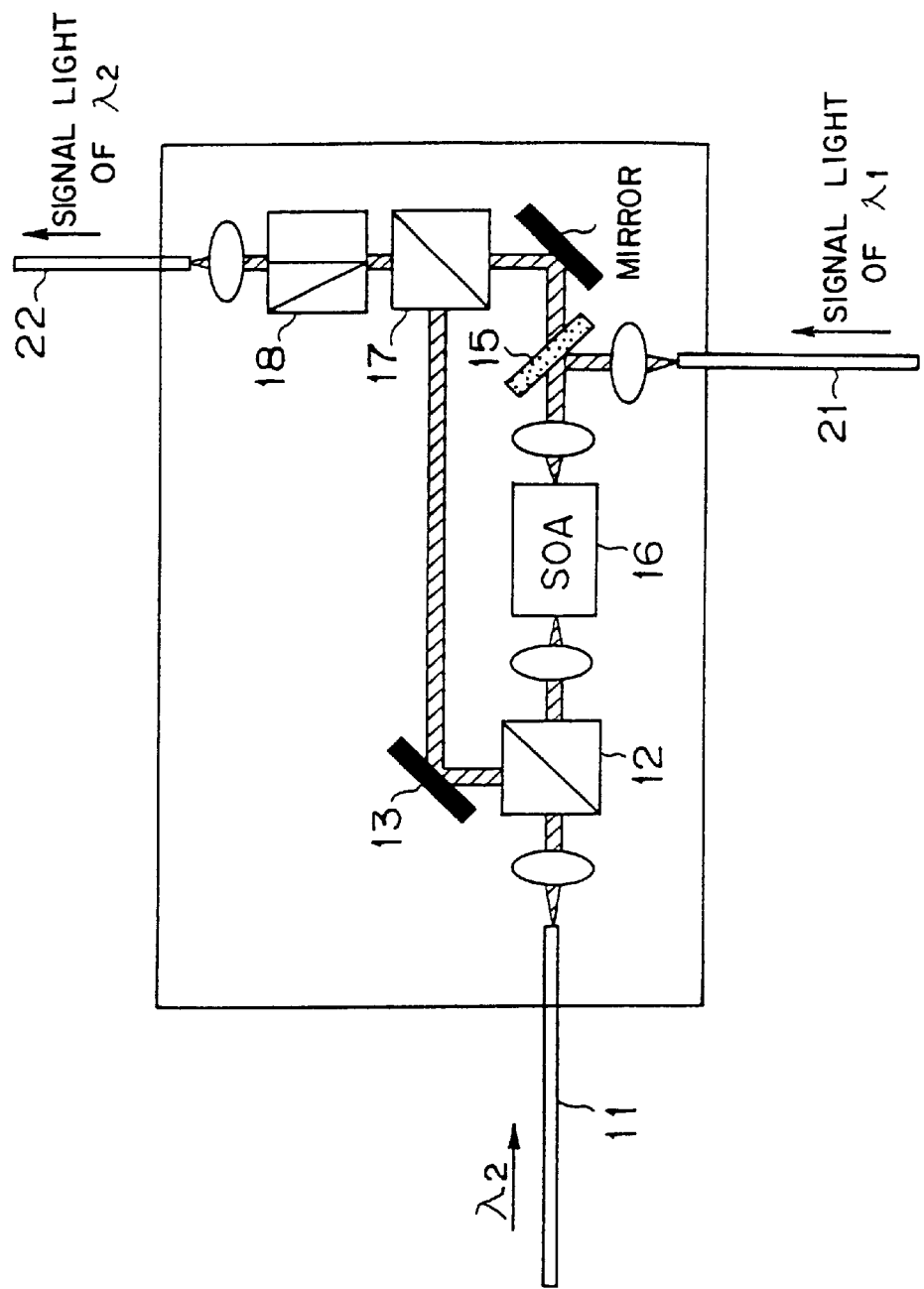
Figure 38:
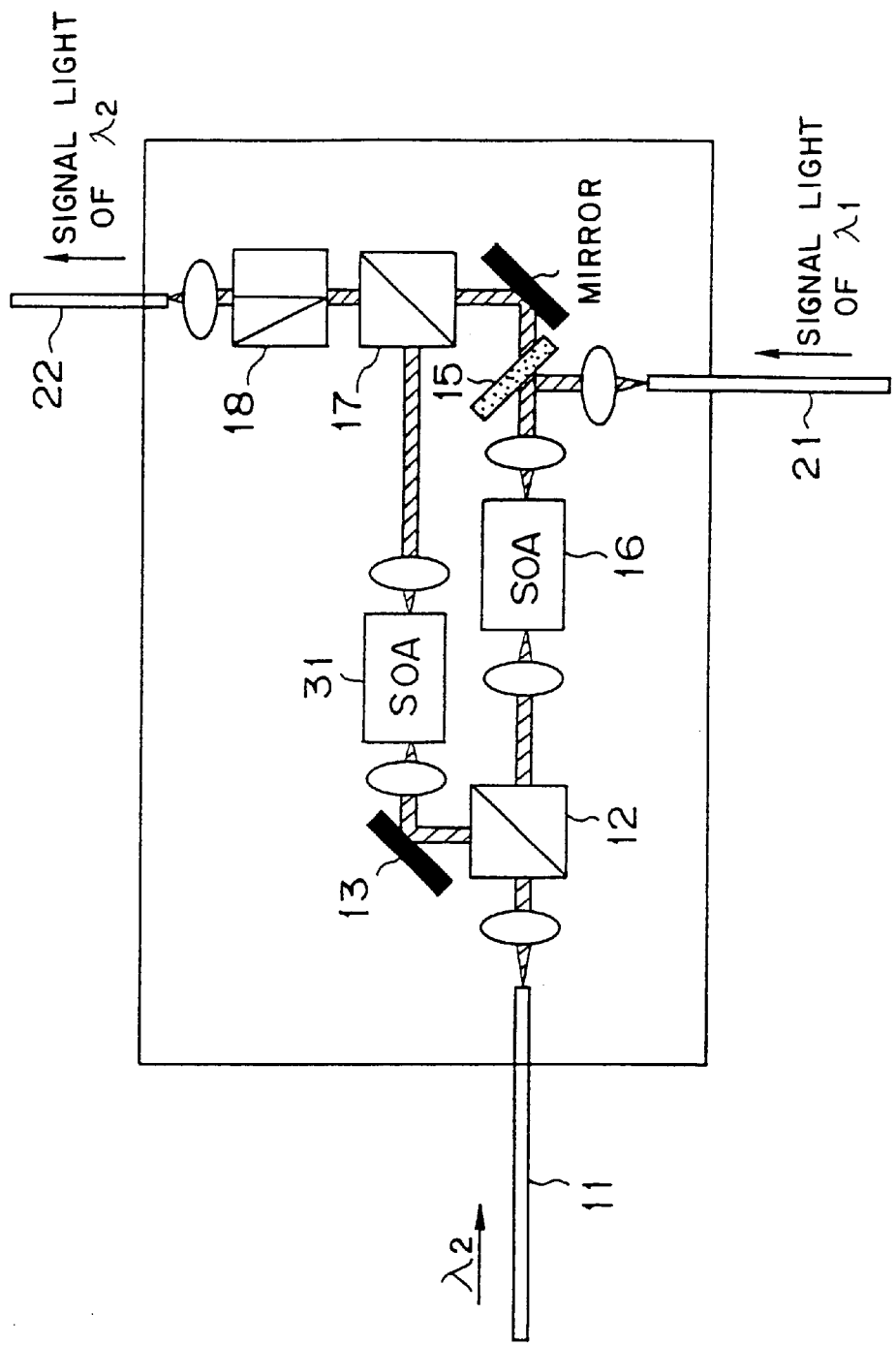
Figure 40:
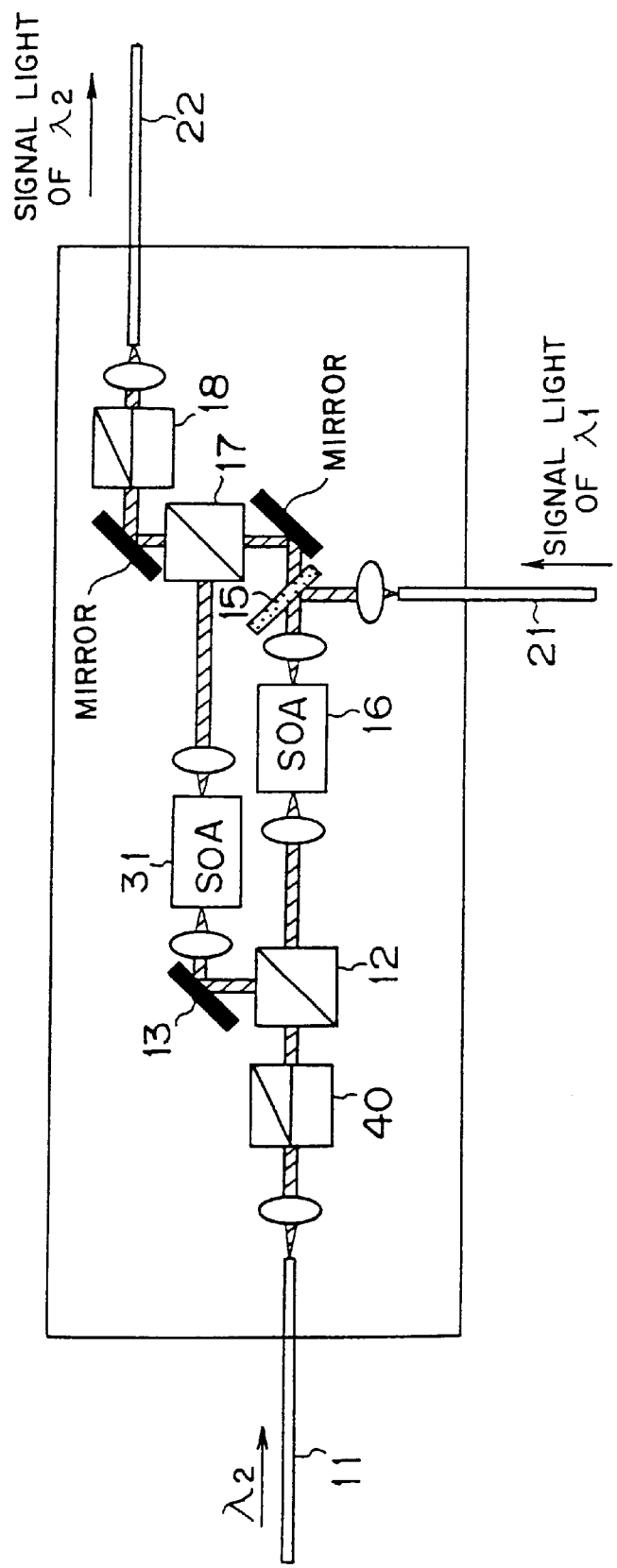

The improvement according to the twenty-fifth embodiment of the present invention shown in FIG. 37 is described below by referring to the second embodiment shown in FIG. 12. According to the second embodiment, the optical path-length of the Y polarized wave is longer than the optical path-length of the X polarized wave from the polarizer 12 to the polarizer 17. According to the twenty-fifty embodiment of the present invention, the optical path-length of the X polarized wave from the polarizer 12 to the polarizer 17 matches the optical path-length of the Y polarized wave by changing the arrangement of the reflecting device, the polarizer 17 and the polarizer 18. This configuration is the same as those according to the twenty-sixth through the twenty-ninth embodiments of the present invention.

Thus, with the configuration in which the two optical path-lengths from the polarizer 12 to the polarizer 17 match each other, a fluctuation of the output power at wavelength λ2 can be reduced (or actually 0) against a change in temperature.

In each of the above described embodiments of the present invention, it is desired to have a short optical path in the wavelength converter to stabilize the operations of the wavelength converter against the fluctuation of the input wavelength. Especially, it is recommended to have shorter optical paths of polarized waves which are normal to each other and obtained by the polarizer 12. Therefore, optical elements (including a semiconductor optical amplifier) according to each of the above described embodiments can be integrated in the waveguide used as a substrate of silicon, etc.

Figure 42A:
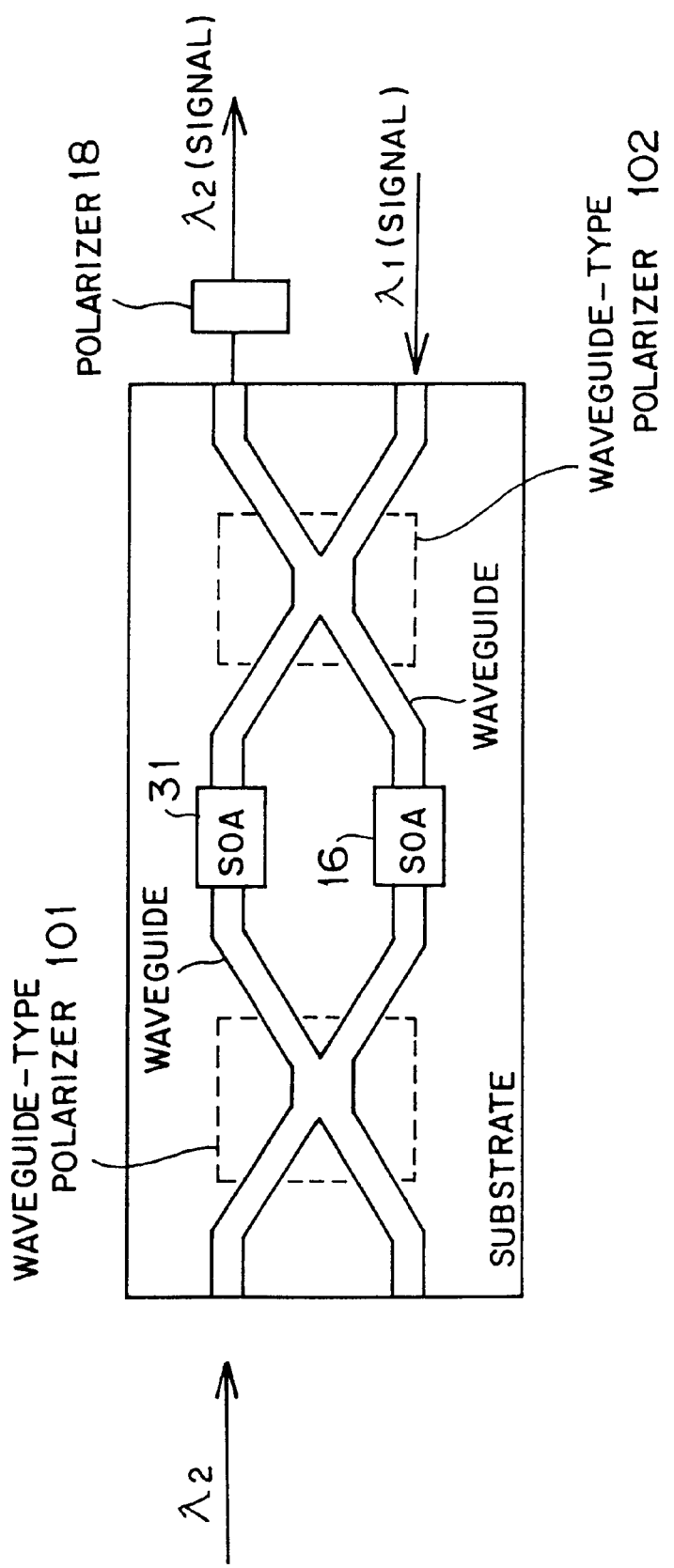
FIGS. 42A and 42B show embodiments of the wavelength converter whose polarizer is formed by a waveguide.
Figure 42B:
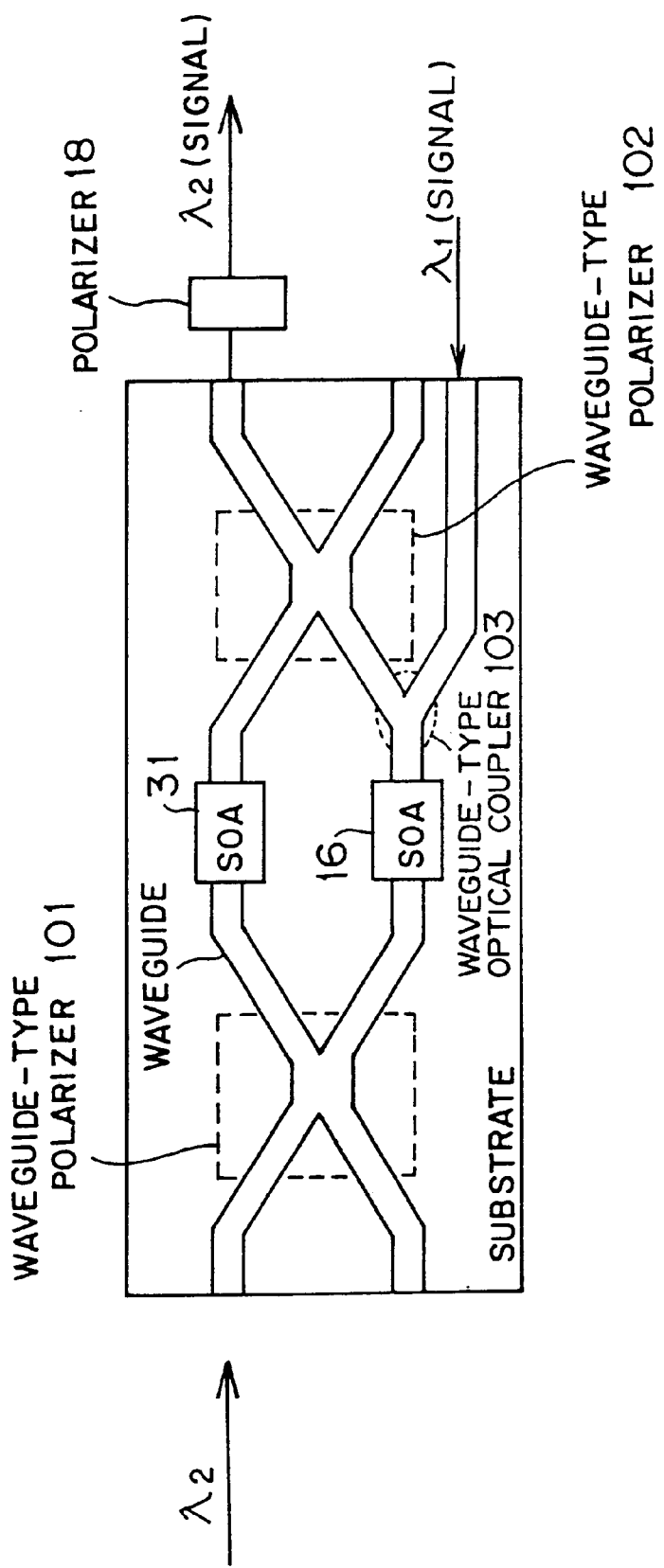
Figure 43B:
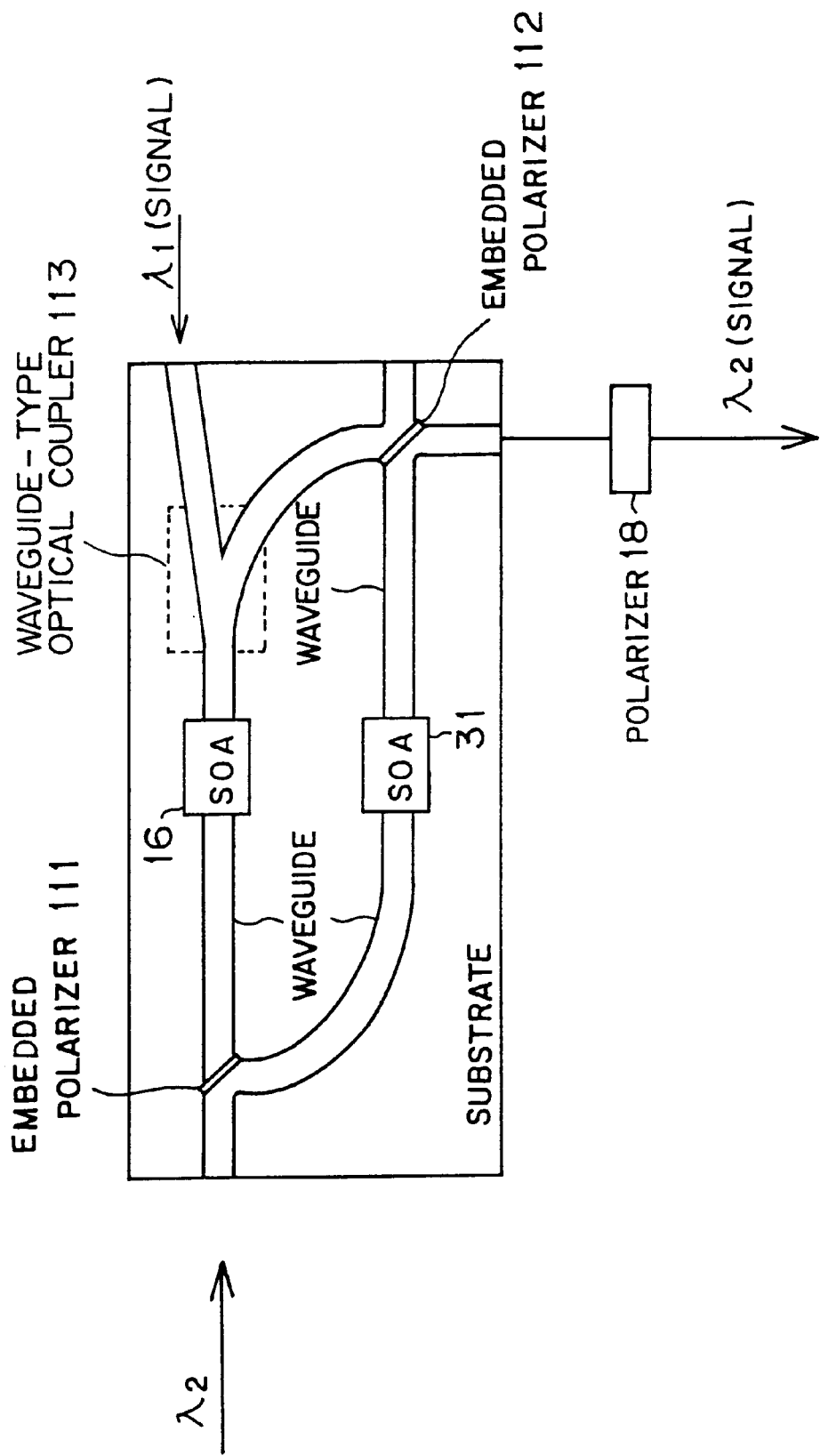

Described below is an embodiment of the wavelength converter comprising a polarizer in an optical waveguide. A method of providing a polarizer in a waveguide can be realized by the configuration in which a birefringence material (for example, $LiNbO_3$) is used in a part of the waveguide, and by the configuration in which a small polarizer is embedded in a normal waveguide. FIGS. 42A and 42B show embodiments of the former, and FIGS. 43A and 43B show embodiments of the latter.

The wavelength converter shown in FIGS. 42A and 42B are realized by, for example, providing the polarizer 12, the semiconductor optical amplifiers 16 and 31, and the polarizer 17, shown in FIG. 24, on an optical waveguide substrate. That is, with the wavelength converter shown in FIG. 42A, the function of the polarizers 12 and 17 is realized by the waveguide-type polarizers 101 and 102. The waveguide-type polarizer is disclosed by, for example, Japanese Laid-open Patent Publication (Tokkaihei) No. 57-68805, "Lowinsertion-loss/Narrow Band AOTF for ASE Elimination", 1997, (the Institute of Electronics Information and Communication Engineers) Proceedings of the 1997 Electronics Society Conference of IEICE C-3-35; and "Polarization Independent Acousto-optic Filter Integrating Newly Developed Passive Polarization Beam Splitter", 1994, Proceedings of the 1994 IEICE Spring Conference C-274, etc.

In the wavelength converter shown in FIG. 42A, the incident light having the wavelength $\lambda 2$ is separated by the waveguide-type polarizer 101 into the X and Y polarized waves and are led to the semiconductor optical amplifiers 16 and 31 respectively. The X and Y polarized waves having the wavelength $\lambda 2$ amplified by the semiconductor optical amplifiers 16 and 31 respectively are coupled and output by the waveguide-type polarizer 102. The signal light having the wavelength $\lambda 1$ is led by the waveguide-type polarizer 102 to one of the semiconductor optical amplifiers 16 and 31. The polarizer 18 outputs as a signal light a predetermined polarized element from a light having the wavelength $\lambda 2$ coupled by the waveguide-type polarizer 102 to a predetermined waveguide or an optical fiber.

In FIG. 42A, the polarizer 18 is provided as independent of the optical waveguide substrate. This polarizer 18 can also be realized as a waveguide-type polarizer. Furthermore, the polarizer provided in the wavelength converter in each of the above described embodiments can be realized as a waveguide-type polarizer.

The wavelength converter shown in FIG. 42B is a variation of the wavelength converter shown in FIG. 42A. The difference between them is the way of inputting the signal light having wavelength $\lambda 1$. In FIG. 42B, an optical coupler 103 is provided so as to lead the signal light having wavelength $\lambda 1$ to the semiconductor optical amplifier 16.

The wavelength converter shown in FIG. 43A has the configuration in which a small polarizer is embedded in a normal waveguide. That is, embedded polarizers 111 and 112 for realizing the function of the polarizers 12 and 17 are provided in the wavelength converter. The operations of the converter are basically the same as those of the converter shown in FIG. 42A. Therefore, the detailed explanation is omitted here.

The wavelength converter shown in FIG. 43B is a variation of the wavelength converter shown in FIG. 43A. The difference between them is the way of inputting the signal light having wavelength $\lambda 1$. In FIG. 43B, an optical coupler 113 is provided so as to lead the signal light having wavelength $\lambda 1$ to the semiconductor optical amplifier 16.

Thus, a waveguide-type polarizer can realize a small wavelength converter with good stability.

Figure 44:
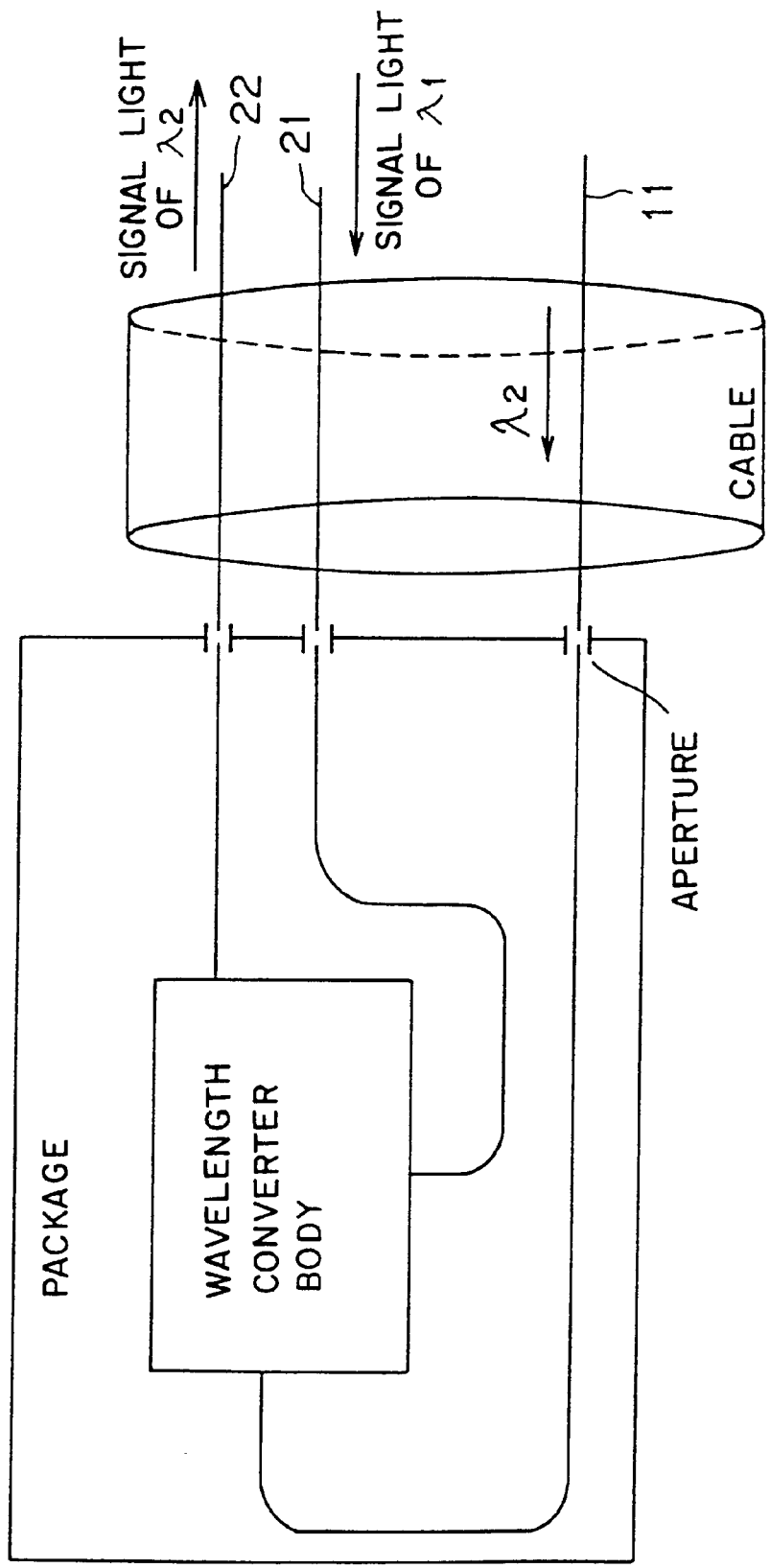
FIG. 44 shows a method of implementing a wavelength converter.

FIG. 44 shows the method of implementing a wavelength converter. Three optical fibers 11, 21, and 22 can be connected to the wavelength converter according to the present embodiment as described above. These optical fibers can be combined as, for example, a single optical fiber cable (optical fiber array). The wavelength converter according to each of the above described embodiments can be put in a package for protecting its optical elements, circuits, etc. from dust, soil, water, etc.

This package has apertures through which the optical fibers 11, 21, and 22 can be connected to the body of the wavelength converter. The apertures are provided as a group. For example, if the package is parallelopiped, the group of apertures is collectively mounted onto a predetermined one of the six planes forming the parallelopiped structure. Through the apertures, a pig-tail optical fiber array can be connected. With the configuration in which an optical connecter is provided at each aperture, the package can be easily removed from the optical cable. Furthermore, when especially three optical fibers 11, 21, and 22 are combined as a single optical fiber cable, these apertures are arranged in the same direction for easy connection.

Figure 45A:
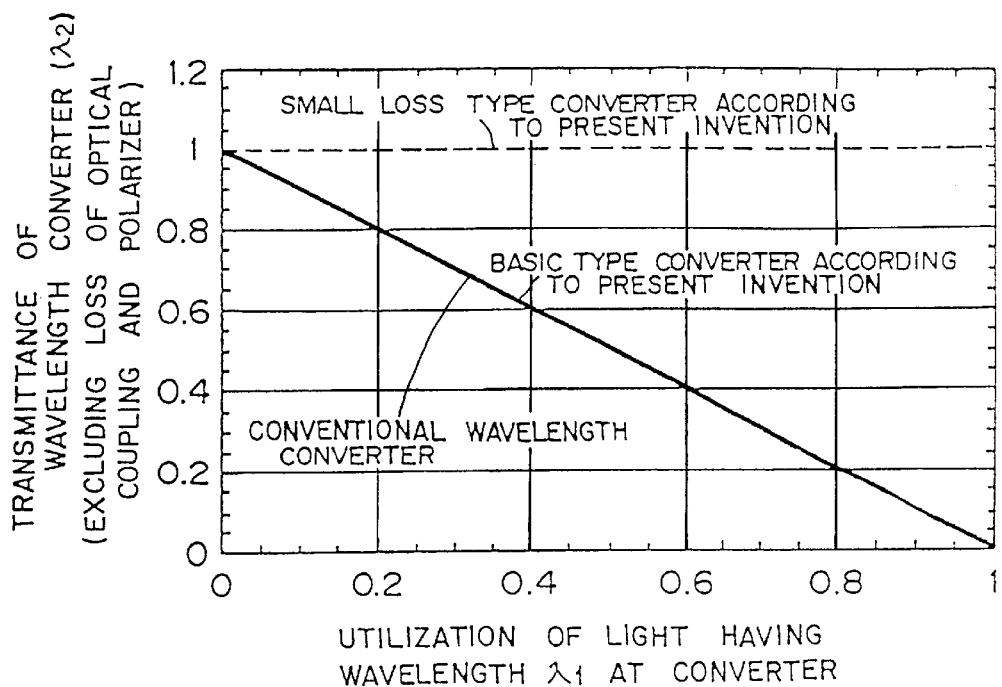
FIG. 45A shows the effect of the present invention.
Figure 45B:
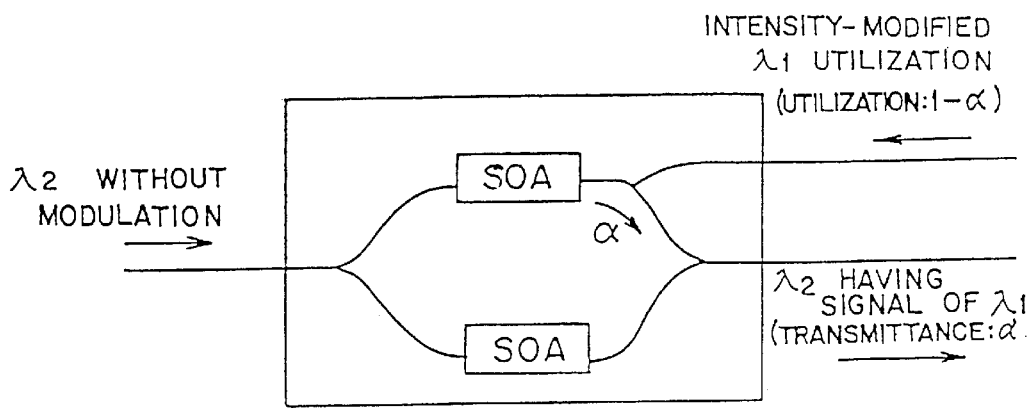
FIG. 45B shows the configuration of the conventional wavelength converter in comparison with the present invention as shown in FIG. 45A.

FIG. 45A shows the effect of the present invention. In FIG. 45A, the transmittance of the wavelength converter for the converted-to light (light having the wavelength $\lambda 2$) relative to the utilization of the converted-from light (light having the wavelength $\Delta 1$) is represented by comparing it with that of the conventional technology. The conventional wavelength converter has the configuration as shown in FIG. 45B (configuration shown in FIG. 2A). The coupling loss at the end portion of each optical fiber, the loss or gain in a waveguide (semiconductor optical amplifier), and the loss in each polarizer are ignored.

The conventional wavelength converter shown in FIG. 45B is the same as the present invention in that the incident light having the wavelength $\lambda 2$ is separated into two lights, and one of the separated lights is changed according to the signal light having the wavelength $\lambda 1$. However, since the conventional wavelength converter must use an optical coupler for letting in the light having wavelength $\lambda_1$ to the waveguide, it inevitably causes loss in the transmission of the light having wavelength $\lambda_2$. Therefore, the conventional wavelength converter has a low transmittance of a light having a converted-to wavelength.

On the other hand, the present invention separates the incident light having the wavelength $\lambda 2$ by a polarizer and so on into two polarized waves normal to each other, and changes one of the polarized waves according to the signal light having the wavelength $\lambda 1$. Therefore, a polarizer with the smallest loss can be used as an optical element for coupling the two polarized waves. As a result, the wavelength converter according to the present invention has a potential of a higher transmittance of a light having a converted-to wavelength than the conventional wavelength converter, In FIG. 45A, the basic type refers to the configurations shown in, for example, FIGS. 11 through 13. The low loss type refers to the configurations shown in, for example, FIGS. 17, 18, and 27 through 34. Since the low loss type leads the signal light having the wavelength $\lambda 1$ to a semiconductor optical amplifier using a polarizer, etc., the transmittance of the light having the wavelength $\lambda 2$ can be set constantly to 1 regardless of the utilization efficiency of the wavelength $\lambda 1$.

The wavelength converter according to the present invention separates the light having the converted-to wavelength into polarized waves normal to each other, changes one of the polarized waves according to the modulation state of a signal light having the converted-from wavelength, and then couples the two polarized waves to output the signal light whose wavelength has been converted as a part of the coupled light.

The conversion efficiency can be improved by designing the configuration of the light having a converted-to wavelength such that an element having a larger loss cannot be passed. Thus, the utilization efficiency of a signal light can also be improved, and the conversion efficiency can be furthermore improved by obtaining a light having the converted-from wavelength using a polarizer.

What is claimed is:

1. A wavelength converter for receiving an intensity-modulated signal light having a first wavelength, and outputting a signal light having a second wavelength modulated based on a modulation state of the received signal light, comprising:

a first polarizer for separating an input light having the second wavelength into first and second polarized waves normal to each other;

one or more waveguides which are provided such that at least one of the first and second polarized waves can pass through, and whose refractive index depends on an intensity of an input light;

a coupling device for coupling the first and second polarized waves at least one of which has passed through said waveguide; and a second polarizer for receiving an output light from said coupling device and outputting a signal light having the second wavelength, wherein the signal light having the first wavelength is input to one of said one or more waveguides.

2. A wavelength converter for receiving an intensity-modulated signal light having a first wavelength, and outputting a signal light having a second wavelength modulated based on a modulation state of the received signal light, comprising:

a first polarizer for separating an input light having the second wavelength into first and second polarized waves normal to each other;

a waveguide which is provided such that the first polarized wave can pass through, and whose refractive index depends on an intensity of an input light;

a coupling device for coupling an output light from said waveguide and the second polarized wave; and a second polarizer for receiving the output light from said coupling device, and outputting a signal light having the second wavelength, wherein the signal light having the first wavelength is input to said waveguide.

3. The converter according to claim 2, wherein said second polarizer separates the output light from said coupling device into two polarized waves normal to each other, and outputs at least one of the polarized waves as a signal light having the second wavelength.

4. The converter according to claim 2, wherein said first and second polarizers are made of a birefringent material or a multilayer film.

5. The converter according to claim 2, wherein said waveguide is a semiconductor amplifier.

6. The converter according to claim 2, wherein the input light having the second wavelength is a linearly polarized wave or an approximately linearly polarized wave.

7. The converter according to claim 2, wherein said coupling device comprises a third polarizer; and said second polarizer is angled by approximately 45 or approximately 135 degrees about the third polarizer on a vertical or approximately vertical plane in a light passage direction.

8. The converter according to claim 2, wherein a half mirror is provided between said first polarizer and said waveguide or between said waveguide and said coupling device; and the signal light having the first wavelength is input to said waveguide using said half mirror.

9. The converter according to claim 2, wherein an optical coupler is provided between said first polarizer and said waveguide or between said waveguide and said coupling device; and the signal light having the first wavelength is input to said waveguide using said optical coupler.

10. The converter according to claim 2, further comprising:

an optical amplifier for amplifying said second polarized wave.

11. The converter according to claim 2, further comprising:

a fourth polarizer for separating the signal light having the first wavelength into third and fourth polarized waves normal to each other; and said third and fourth polarized waves are led to said waveguide using said first polarizer and said coupling device respectively.

12. The converter according to claim 11, wherein a Faraday rotator having a rotation angle of 45 degrees and an optical rotator having a rotation angle of 45 degrees are provided between said waveguide and said coupling device.

13. The converter according to claim 2, wherein a fifth polarizer for receiving the input light having the second wavelength is provided before said first polarizer; and an output from said fifth polarizer is input to said first polarizer.

14. The converter according to claim 2, wherein the signal light having the first wavelength is led to said waveguide using said first polarizer or said coupling device.

15. The converter according to claim 2 wherein a length of an optical path of a first polarized wave from said first polarizer to said coupling device matches a length of an optical path of a second polarized wave from said first polarizer to said coupling device.

16. The converter according to claim 2, further comprising:

a reflecting device having a reflection factor smaller than 1 to lead said first polarized wave to said waveguide, wherein the signal light having the first wavelength is input to said waveguide using the reflecting device.

17. The converter according to claim 2, wherein said first and second polarizers and said coupling device are integrated on a single substrate.

18. The converter according to claim 2, wherein said first and second polarizers, said coupling device, and said waveguide are integrated on a single substrate.

19. The converter according to claim 2, wherein said first polarizer, said coupling device, and said waveguide are integrated on a single substrate.

20. The converter according to claim 2, wherein at least one of said first polarizer, said coupling device, and said second polarizer comprises an optical waveguide.

21. The converter according to claim 2, wherein at least one of said first polarizer, said coupling device, and said second polarizer is embedded in an optical waveguide connected to said waveguide.

22. The converter according to claim 2, wherein input/output of optical fibers for transmitting the signal light having the first wavelength, the input light having the second wavelength, and the signal light having the second wavelength are set in the same direction.

23. A wavelength converter for receiving an intensity-modulated signal light having a first wavelength, and outputting a signal light having a second wavelength modulated based on a modulation state of the received signal light, comprising:

a first polarizer for receiving an input light having a second wavelength;

a second polarizer for separating an output light of said first polarizer into first and second polarized waves normal to each other;

a waveguide which receives the signal light having the first wavelength and the first polarized wave, and whose refractive index depends on an intensity of an input light;

a first reflecting device for leading the output light from said waveguide to said second polarizer;

a second reflecting device for leading the second polarized wave to the second polarizer, wherein said second polarizer couples reflected lights from said first and second reflecting devices, said first polarizer receives the coupled lights from said second polarizer, and outputs a signal light having the second wavelength.

24. The converter according to claim 23, wherein said first reflecting device has a reflection factor smaller than 1, and the signal light having the first wavelength is passed through said first reflecting device and input to said waveguide.

25. The converter according to claim 23, further comprising a third reflecting device whose reflection factor is smaller than 1 to lead the first polarized wave to said waveguide, wherein the signal light having the first wavelength is input to said waveguide using said third reflecting device.

26. The converter according to claim 23, wherein the signal light having the first wavelength is led to said waveguide using said second polarizer.

27. The converter according to claim 23, further comprising:

a first Faraday rotator, provided between said second polarizer and said waveguide, for rotating by 45 degrees a plane of polarization of a passing light;

a second Faraday rotator, provided between said waveguide and said first reflecting device, for rotating by 45 degrees a plane of polarization of a passing light;

an optical rotator, provided between said waveguide and said first reflecting device, for rotating by 45 degrees a plane of polarization of a passing light; and a third polarizer for separating the signal light having the first wavelength into the third and fourth polarized waves normal to each other, wherein the third polarized wave is input to said waveguide through said optical rotator and said second Faraday rotator after a plane of polarization of the third polarized wave is rotated by 45 degrees, and the fourth polarized wave is input to said waveguide through said first Faraday rotator.

28. The converter according to claim 23, wherein said first and second polarizers, and said first and second reflecting devices are integrated on a single substrate.

29. The converter according to claim 23, wherein said first and second polarizers, said first and second reflecting devices, and said waveguide are integrated on a single substrate.

30. The converter according to claim 23, wherein at least one of said first and second polarizers is an optical waveguide.

31. The converter according to claim 23, wherein at least one of said first and second polarizers is embedded in an optical waveguide connected to said waveguide.

32. The converter according to claim 23, wherein input/output of optical fibers for transmitting the signal light having the first wavelength, the input light having the second wavelength, and the signal light having the second wavelength are set in the same direction.

33. A wavelength converter for receiving an intensity-modulated signal light having a first wavelength, and outputting a signal light having a second wavelength modulated based on a modulation state of the received signal light, comprising:

generation means for generating first and second polarized waves which have a second wavelength and are normal to each other;

a waveguide which receives the signal light having the first wavelength and the first polarized wave, and whose refractive index depends on an intensity of an input light;

a coupling device for coupling an output light from said waveguide with the second polarized wave; and a second polarizer for receiving an output light from said coupling device and outputting a signal light having the second wavelength.

34. A wavelength converting method for receiving an intensity-modulated signal light having a first wavelength, and outputting a signal light having a second wavelength modulated based on a modulation state of the received signal light, comprising the steps of:

separating, using a polarizer, an input light having the second wavelength into first and second polarized waves normal to each other;

passing the first polarized wave through a waveguide whose refractive index depends on an intensity of an input light;

inputting the signal light having the first wavelength to the waveguide;

coupling an output light from the waveguide with the second polarized wave; and receiving the coupled light and outputting the signal light having the second wavelength.

* * * * *

UNITED STATES PATENT AND TRADEMARK OFFICE
CERTIFICATE OF CORRECTION

PATENT NO. : 6,256,137 B1
DATED : July 3, 2001
INVENTOR(S) : Kazuo Hironishi

It is certified that error appears in the above-identified patent and that said Letters Patent is hereby corrected as shown below:

Column 19,
Line 39, change "birefringent" to -- birefringence --

Signed and Sealed this

Eleventh Day of December, 2001

*Attest:*

NICHOLAS P. GODICI
*Attesting Officer*    *Acting Director of the United States Patent and Trademark Office*